US012185481B2

(12) United States Patent
Cho et al.

(10) Patent No.: US 12,185,481 B2
(45) Date of Patent: Dec. 31, 2024

(54) ELECTRONIC DEVICE INCLUDING DISPLAY

(71) Applicant: SAMSUNG ELECTRONICS CO., LTD., Suwon-si (KR)

(72) Inventors: Sunggun Cho, Suwon-si (KR); Jinwook Baik, Suwon-si (KR); Byounguk Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 203 days.

(21) Appl. No.: 18/087,354

(22) Filed: Dec. 22, 2022

(65) Prior Publication Data

US 2023/0309246 A1    Sep. 28, 2023

Related U.S. Application Data

(63) Continuation of application No. PCT/KR2022/020036, filed on Dec. 9, 2022.

(30) Foreign Application Priority Data

Mar. 25, 2022  (KR) .................. 10-2022-0037677
May 24, 2022   (KR) .................. 10-2022-0063545

(51) Int. Cl.
*H05K 5/02*   (2006.01)
*G04G 17/04*  (2006.01)
*H05K 5/00*   (2006.01)

(52) U.S. Cl.
CPC ............. *H05K 5/02* (2013.01); *G04G 17/045* (2013.01); *H05K 5/0086* (2013.01)

(58) Field of Classification Search
CPC ...................................................... H05K 5/02
See application file for complete search history.

(56) References Cited

U.S. PATENT DOCUMENTS 9,354,614 B2     5/2016  Dubois et al.
2005/0249050 A1 11/2005  Apotheloz et al.
(Continued)

FOREIGN PATENT DOCUMENTS

CN    103336604      10/2013
JP    2018-045053     3/2018
(Continued)

OTHER PUBLICATIONS

International Search Report dated Mar. 20, 2023 for PCT/KR2022/020036.
PCT Written Opinion dated Mar. 20, 2023 for PCT/KR2022/020036.

*Primary Examiner* — Sherman Ng
(74) *Attorney, Agent, or Firm* — Nixon & Vanderhye P.C.

(57) ABSTRACT

An electronic device may include a front housing including an opening and a bonding area formed around the opening; a display module disposed to cover the opening by at least part thereof, wherein the display module may include: a display to provide visual information to a user; a base disposed along an edge area of the display and including a bonding part formed to correspond to the bonding area; and a stopper disposed to surround at least part of the bonding part and formed toward the housing, to provide a bonding space between the bonding area and the bonding part; and an adhesive member disposed in the bonding space, to connect between the bonding area and the bonding part. Various other implementation modifications are available.

20 Claims, 27 Drawing Sheets

(56) References Cited

U.S. PATENT DOCUMENTS

| | | |
|---|---|---|
| 2015/0212362 A1 | 7/2015 | Takaira |
| 2018/0203418 A1* | 7/2018 | Chung et al. |
| 2019/0027812 A1* | 1/2019 | Kim .................. H04M 1/18 |
| 2019/0072903 A1* | 3/2019 | Park .................. G04G 13/00 |
| 2019/0251320 A1* | 8/2019 | Kim .................. G06V 40/1306 |
| 2020/0288593 A1 | 9/2020 | Hooton et al. |
| 2021/0195772 A1 | 6/2021 | Ko |
| 2021/0405688 A1 | 12/2021 | Barrett et al. |

FOREIGN PATENT DOCUMENTS

| | | |
|---|---|---|
| KR | 10-1000508 B1 | 12/2010 |
| KR | 10-2011-0103761 | 9/2011 |
| KR | 10-2017-0017640 A | 2/2017 |
| KR | 10-1808986 B1 | 12/2017 |
| KR | 10-2021-0079657 A | 6/2021 |
| KR | 10-2022-0000368 | 1/2022 |
| KR | 10-2022-0000368 A | 1/2022 |

\* cited by examiner (a)

(b)

(a)

(b)

ELECTRONIC DEVICE INCLUDING DISPLAY

CROSS REFERENCE TO RELATED APPLICATIONS

This application is a continuation of International Application No. PCT/KR2022/020036, filed on Dec. 9, 2022, designating the United States, in the Korean Intellectual Property Receiving Office, and claiming priority to Korean patent application number 10-2022-0037677 filed on Mar. 25, 2022, and to Korean patent application number 10-2022-0063545 filed on May 24, 2022, the disclosures of which are all hereby incorporated by reference herein in their entireties.

BACKGROUND

Field

Various example embodiments relate to an electronic device including a display.

Description of Related Art

An electronic device may refer to a device that performs a specific function according to a loaded program, such as an electronic notebook, a portable multimedia player, a mobile communication terminal, a tablet PC, a video/audio device, a desktop/laptop computer, or a vehicle navigation device as well as a home appliance. For example, these electronic devices may output stored information as sound or an image. As the integration level of electronic devices increases and high-speed and large-capacity wireless communication becomes common, a single electronic device such as a mobile communication terminal may be equipped with various functions in recent years. For example, various functions including a communication function, an entertainment function such as games, a multimedia function such as music/video playback, a communication and security function for mobile banking, schedule management, or an electronic wallet function are integrated into one electronic device. Such electronic devices are being miniaturized so that users may conveniently carry them. Owing to the development of electronic and communication technology, electronic devices become smaller and more lightweight so that they may be used conveniently, while worn on a body.

The above information may be presented as background information only to assist with an understanding of the disclosure. No determination has been made, and no assertion is made, as to whether any of the above might be applicable as prior art with regard to the disclosure.

SUMMARY

In an electronic device including a display module, the size of a display panel needs to be increased within a limited space (e.g., a housing of the electronic device) to provide a wider screen to a user. The display module is usually attached to the housing that forms the exterior of the electronic device. Accordingly, it is necessary to maintain the size of the display panel and increase the manufacturing efficiency of processing an adhesion part, while increasing an adhesion force by attaching the display module with the housing over a wider adhesion area.

An example embodiment addresses at least one or more of the above-mentioned problems and/or disadvantages to provide at least one or more of the advantages described below. An example embodiment may provide an electronic device which may increase a binding force between a display module and a housing and provide a wide screen to a user.

According to various example embodiments, an electronic device may include a front housing including an opening and a bonding area formed around the opening; a display module disposed to cover the opening by at least part thereof, wherein the display module may include: a display part to provide visual information to a user; a base member disposed along an edge area of the display part and including a bonding part formed to correspond to the bonding area; and a stopper disposed to surround at least part of the bonding part and formed toward the housing, to provide a bonding space between the bonding area and the bonding part; and an adhesive member disposed in the bonding space, to connect between at least the bonding area and the bonding part.

According to various example embodiments, an electronic device may include a front housing including an opening and a bonding area formed to be directed in a first direction around the opening; a display module bonded to the front housing to provide visual information to a user, wherein the display module includes a window, a display panel disposed on the window and outputting visual information, and a circuit board connected, directly or indirectly, to the display panel; a base member disposed along a periphery of the display part, and including a bonding part formed to be directed in a second direction opposite to the first direction to face the bonding area; and a stopper including a support part at least partially disposed along a periphery of the base member on the base member or inside the base member, and a protrusion extending in the second direction from the support part; and an adhesive member to couple the bonding area and the bonding part with each other. The protrusion may provide a bonding space being a gap space between the bonding area and the bonding part by contact between an end of the protrusion in the second direction and the bonding area, and the adhesive member may be disposed inside the bonding space.

According to various example embodiments, an electronic device may be provided, which has an increased binding force between a display module and a housing and a display panel with a wider area by use of a stopper disposed in the display module.

The effects achievable are not limited to what has been described above, and those skilled in the art will clearly understand other unmentioned effects from the following description.

BRIEF DESCRIPTION OF THE DRAWINGS

The foregoing and other features of example embodiments will become more apparent from the following detailed description of embodiments when read in conjunction with the accompanying drawings. In the drawings, like reference numerals refer to like elements.

Like reference numerals may be assigned to similar components, configurations, and/or structures throughput the accompanying drawings.

DETAILED DESCRIPTION

The following description of the appended drawings may provide an understanding of the claims and various exemplary implementations of the disclosure including their equivalents. Although an exemplary embodiment disclosed in the following description includes various specific details to aid the understanding, it is considered to be one of various exemplary embodiments. Accordingly, those skilled in the art will understand that various changes and modifications can be made to the various implementations described herein without departing from the spirit and scope of the disclosure. In addition, a description of well-known functions and configurations may be omitted for clarity and brevity.

Terms and words used in the following description and the claims are not limited to their bibliographical meanings, and may be used to clearly and consistently describe an example embodiment. Therefore, it will be apparent to those skilled in the art that the following description of various implementations of the disclosure is provided for the purpose of explanation, not for the purpose of limiting the disclosure that defines the scope of rights and its equivalent.

It is to be understood that a singular form such as "a", "an", or "the" includes plural referents, unless the context clearly dictates otherwise. Therefore, for example, "a surface of a component" may be understood to include one or more of the surfaces of the component.

Figure 1:
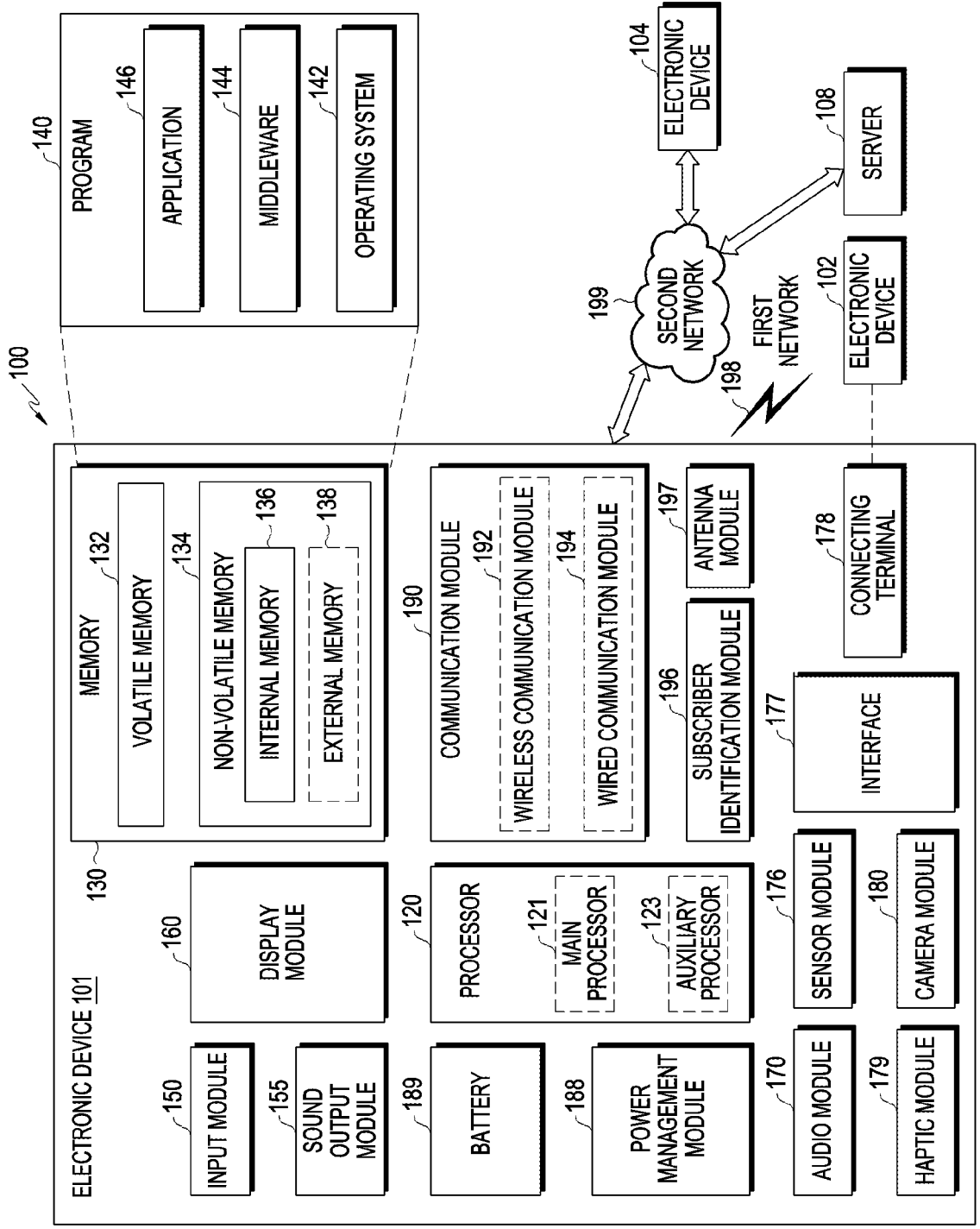
FIG. 1 is a block diagram illustrating an electronic device in a network environment according to various example embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In a certain embodiment, at least one of the components (e.g., the connecting terminal 178) may be omitted from the electronic device 101, or one or more other components may be added in the electronic device 101. In a certain embodiment, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
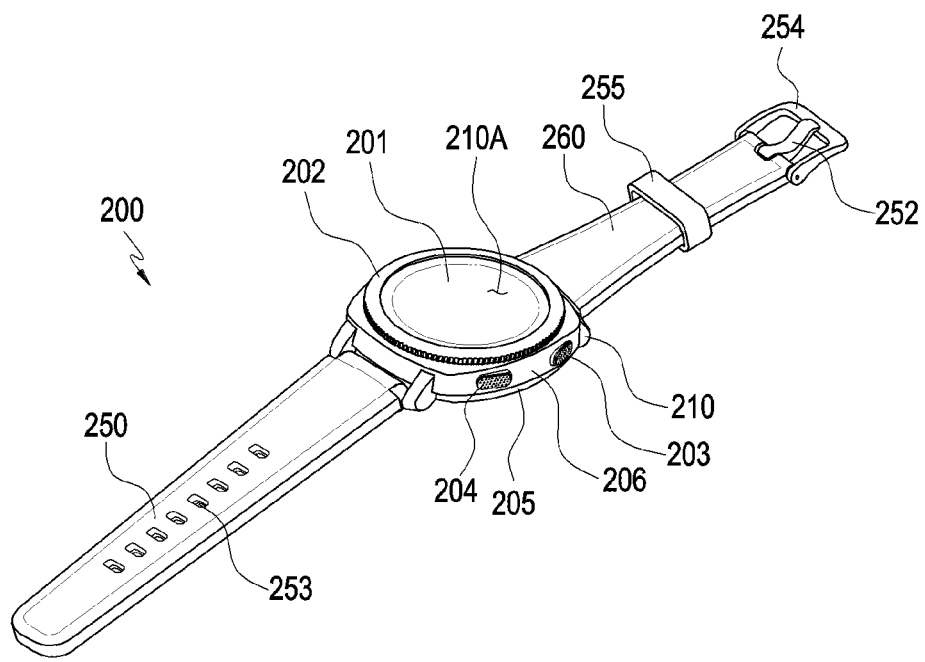
FIG. 2 is a perspective view illustrating an electronic device according to an example embodiment.
Figure 3:
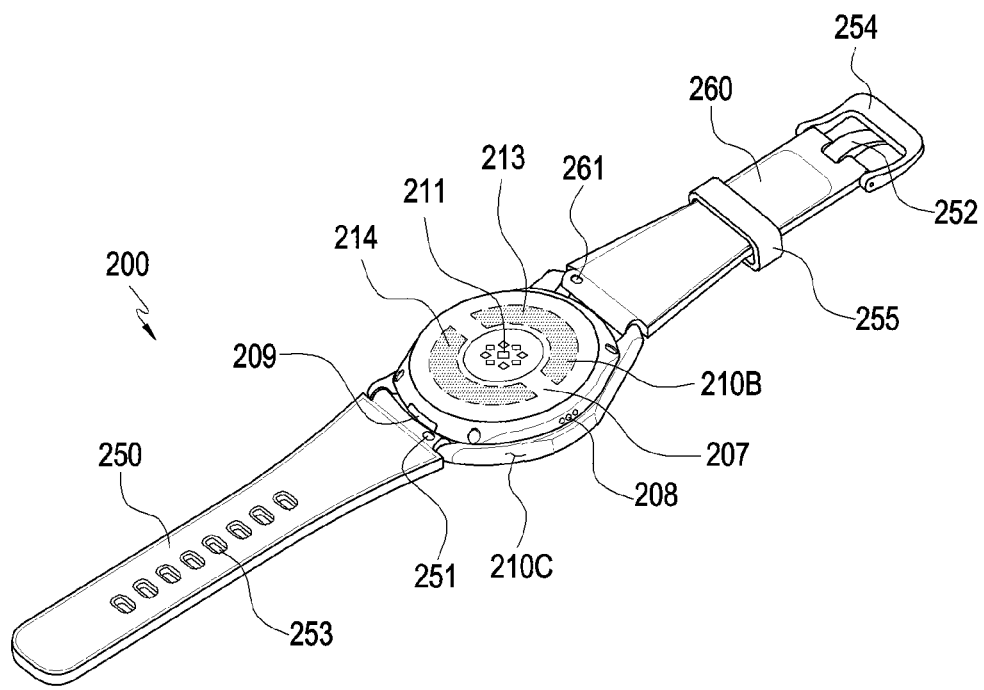
FIG. 3 is a perspective view illustrating the electronic device of FIG. 2 from a different angle.

Referring to FIGS. 2 and 3, an electronic device 200 (e.g., the electronic device 101 of FIG. 1) according to an embodiment may include a housing 210 which includes a first surface (or front surface) 210A, a second surface (or rear surface) 210B, and a side surface 210C surrounding a space between the first surface 210A and the second surface 210B, and fastening members 250 and 260 connected, directly or indirectly, to at least part of the housing 210 and configured to be detachably fasten the electronic device 200 to a user's body part (e.g., wrist or ankle). In another embodiment (not shown), the housing may refer to a structure that forms part of the first surface 210A, the second surface 210B, and the side surface 210C of FIG. 2. According to an embodiment, at least part of the first surface 210A may be formed by a front plate 201 (e.g., a glass plate or polymer plate including various coating layers) which is at least partially substantially transparent. The second surface 210B may be formed by a substantially opaque rear plate 207. The rear plate 207 may be formed of, for example, coated or tinted glass, ceramic, a polymer, a metal (e.g., aluminum, stainless steel (STS), or magnesium), or a combination of at least two of these materials. The side surface 210C may be formed by a side bezel structure (or "side member") 206 coupled with the front plate 201 and the rear plate 207 and including a metal and/or a polymer. In a certain embodiment, the rear plate 207 and the side bezel structure 206 may be integrally formed and include the same material (e.g., a metal material such as aluminum). The fastening members 250 and 260 may be formed of any of various materials in any of various shapes. A woven fabric, leather, rubber, urethane, a metal, ceramic, or a combination of at least two of these materials may be used to form an integrated type and a plurality of unit links to be movable with each other.

According to an embodiment, the electronic device 200 may include at least one of a display 330 (see FIG. 3), audio modules 205 and 208, a sensor module 211, key input devices 202, 203 and 204, or a connector hole 209. In a certain embodiment, the electronic device 200 may not be provided with at least one (e.g., the key input devices 202, 203 and 204, the connector hole 209, or the sensor module 211) of the components or additionally include other components.

According to an embodiment, the display 330 may be exposed, for example, through a substantial portion of the front plate 201. The shape of the display 330 may correspond to that of the front plate 201, and may be a circle, an oval, or a polygon. The display 330 may be incorporated with or disposed adjacent to a touch sensing circuit, a pressure sensor that measures the intensity (pressure) of a touch, and/or a fingerprint sensor.

The audio modules 205 and 208 may include a microphone hole 205 and a speaker hole 208. A microphone for obtaining an external sound may be disposed in the microphone hole 205, and in a certain embodiment, a plurality of microphones may be disposed to detect the direction of a sound. The speaker hole 208 may be used as an external speaker and a receiver for calls. In a certain embodiment, the speaker hole 208 and the microphone hole 205 may be implemented as a single hole, or a speaker (e.g., a piezo speaker) may be included without the speaker hole 208.

The sensor module 211 may generate an electrical signal or data value corresponding to an internal operation state of the electronic device 200 or an external environmental state. The sensor module 211 may include, for example, a biometric sensor module 211 (e.g., a heart rate monitor (HRM) sensor) disposed on the second surface 210B of the housing 210. The electronic device 200 may further include a sensor module (not shown), for example, at least one of a gesture sensor, a gyro sensor, a barometric pressure sensor, a magnetic sensor, an acceleration sensor, a grip sensor, a color sensor, an IR sensor, a biometric sensor, a temperature sensor, a humidity sensor, or an illuminance sensor.

The sensor module 211 may include electrode areas 213 and 214 that form part of a surface of the electronic device 200, and a biosignal detection circuit (not shown) electrically connected, directly or indirectly, to the electrode areas 213 and 214. For example, the electrode areas 213 and 214 may include a first electrode area 213 and a second electrode area 214 which are disposed on the second surface 210B of the housing 210. The sensor module 211 may be configured such that the electrode areas 213 and 214 obtain an electrical signal from the user's body part, and the biosignal detection circuit detects biometric information about the user based on the electrical signal.

The key input devices 202, 203, and 204 may include a wheel key 202 disposed on the first side 210A of the housing 210 and rotatable in at least one direction, and/or side key buttons 203 and 204 disposed on the side 210C of the housing 210. The wheel key 202 may have a shape corresponding to that of the front plate 201. In another embodiment, the electronic device 200 may not include some or any of the above-mentioned key input devices 202, 203, and 204, and the non-included key input devices 202, 203, and 204 may be implemented in another form such as a soft key on the display 330. The connector hole 209 may accommodate a connector (e.g., a USB connector) for transmitting and receiving power and/or data to and from an external electronic device, and another connector hole (not shown) for accommodating a connector for transmitting and receiving an audio signal to and from an external electronic device. The electronic device 200 may further include, for example, a connector cover (not shown) that covers at least part of the connector hole 209 and blocks or substantially blocks the introduction of a foreign material into the connector hole 209.

The fastening members 250 and 260 may be detachably fastened to at least a partial area of the housing 210 using locking members 251 and 261. The fastening members 250 and 260 may include one or more of a fixing member 252, a fixing member fastening hole 253, a band guide member 254, and a band fixing loop 255.

The fixing member 252 may be configured to fix the housing 210 and the fastening members 250 and 260 to the user's body part (e.g., a wrist or an ankle). The fixing member fastening hole 253 may fix the housing 210 and the fastening members 250 and 260 to the user's body part in correspondence with the fixing member 252. The band guide member 254 may be configured to limit a movement range of the fixing member 252, when the fixing member 252 is fastened in the fixing member fastening hole 253, so that the fastening members 250 and 260 are fastened to the user's body part in close contact. The band fixing loop 255 may limit movement ranges of the fastening members 250 and 260, with the fixing member 252 fastened in the fixing member coupling hole 253.

Figure 4:
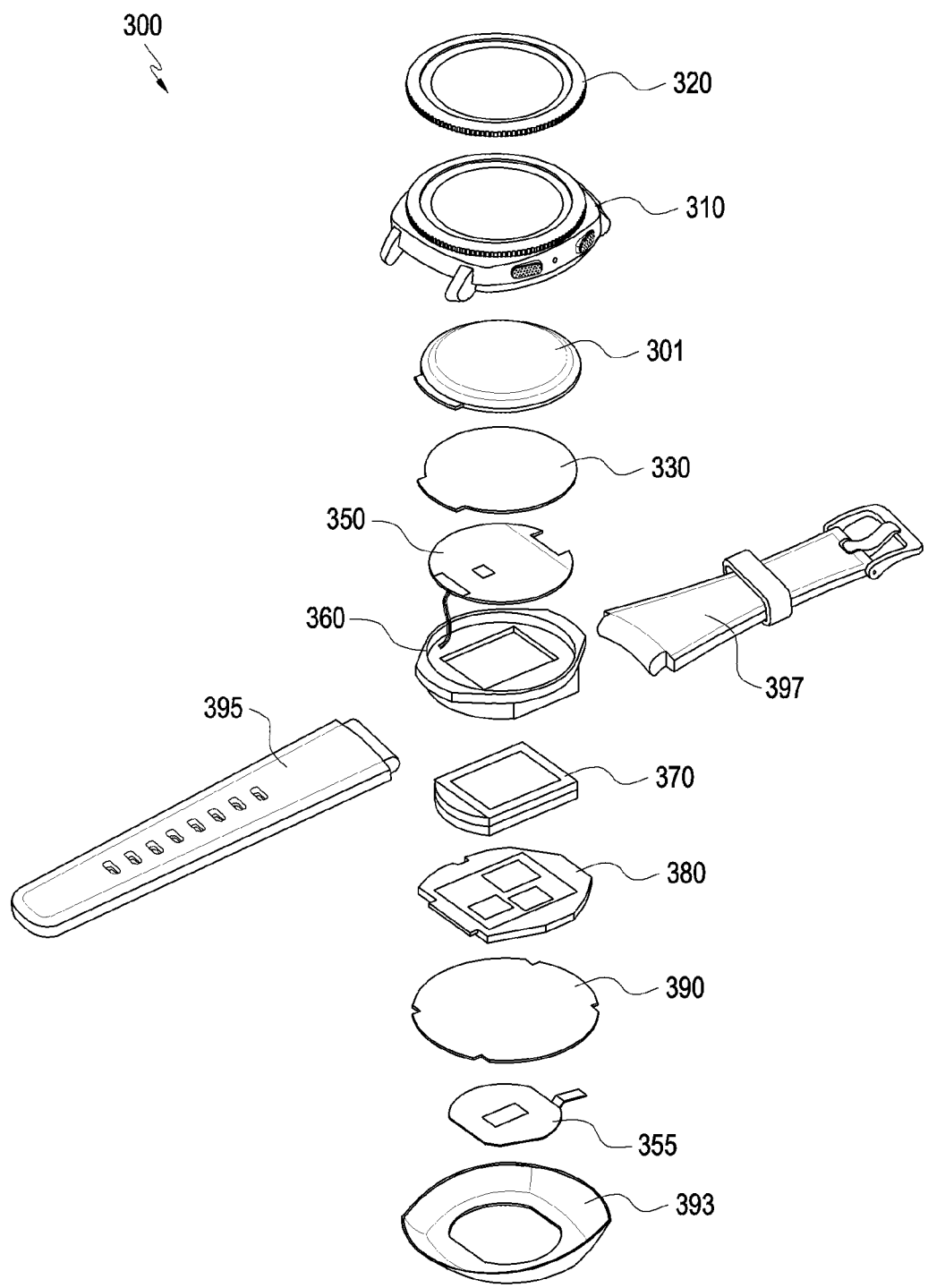
FIG. 4 is an exploded perspective view illustrating an electronic device according to an example embodiment.

Referring to FIG. 4, an electronic device 300 (e.g., the electronic device 101 of FIG. 1 or the electronic device 200 of FIG. 2 or FIG. 3) may include a side bezel structure 310, a wheel key 320, a front plate 301, a display 330, a first antenna 350, a second antenna 355, a support member 360 (e.g., a bracket), a battery 370, a printed circuit board (PCB) 380, a sealing member 390, a rear plate 393, and fastening members 395 and 397. At least one of the components of the electronic device 300 may be the same as or similar to at least one of the components of the electronic device 101 of FIG. 1 or the electronic device 200 of FIG. 2, and a redundant description will be avoided herein. The support member 360 may be disposed inside the electronic device 300 and connected, directly or indirectly, to the side bezel structure 310, or may be integrally formed with the side bezel structure 310. The support member 360 may be formed of, for example, a metal material and/or a non-metal (e.g., polymer) material. The support member 360 may have one surface coupled with the display 330 and the other surface coupled, directly or indirectly, with the PCB 380. The PCB 380 may have a processor, memory, and/or an interface mounted thereon. The processor may include, for example, one or more of a CPU, an AP, a GPU, an AP sensor processor, or a CP. Each processor herein comprises processing circuitry.

The memory may include, for example, volatile memory or non-volatile memory. The interface may include, for example, an HDMI, a USB interface, an SD card interface, and/or an audio interface. The interface may, for example, electrically or physically connect the electronic device 300 to an external electronic device, and include a USB connector, an SD card/multimedia card (MMC) connector, or an audio connector.

The battery 370 is a device for supplying power to at least one component of the electronic device 300 and may include, for example, a non-rechargeable primary battery, a rechargeable secondary battery, or a fuel cell. At least part of the battery 370 may be disposed substantially on the same plane as the PCB 380. The battery 370 may be integrally disposed inside the electronic device 300 or disposed detachably from the electronic device 300.

The first antenna 350 may be disposed between the display 330 and the support member 360. The first antenna 350 may include, for example, a near field communication (NFC) antenna, a wireless charging antenna, and/or a magnetic secure transmission (MST) antenna. The first antenna 350 may, for example, perform short-range communication with an external device, wirelessly transmit and receive power required for charging, and transmit a magnetic-based signal including a short-range communication signal or payment data. In another embodiment, an antenna structure may be formed by part of the side bezel structure 310 and/or the support member 360 or a combination of them.

The second antenna 355 may be disposed between the PCB 380 and the rear plate 393. The second antenna 355 may include, for example, an NFC antenna, a wireless charging antenna, and/or an MST antenna. The second antenna 355 may, for example, perform short-range communication with an external device, wirelessly transmit and receive power required for charging, and transmit a magnetic-based signal including a short-range communication signal or payment data. In another embodiment, an antenna structure may be formed by part of the side bezel structure 310 and/or the rear plate 393 or a combination of them.

The sealing member 390 may be located between at least the side bezel structure 310 and the rear plate 393. The sealing member 390 may be configured to block the introduction of moisture and a foreign material from the outside into a space surrounded by the side bezel structure 310 and the rear plate 393.

Figure 5:
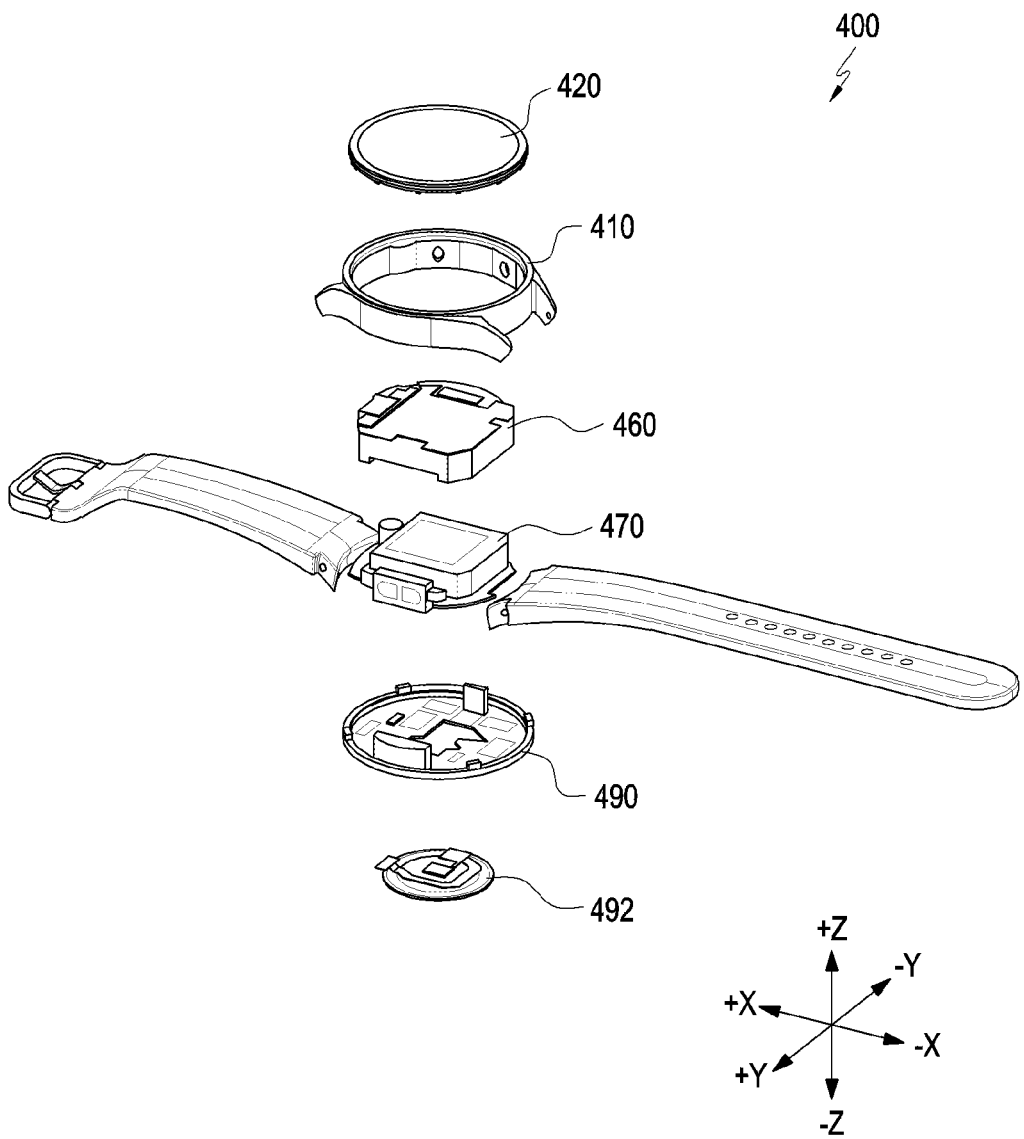
FIG. 5 is a simple exploded perspective view mainly illustrating a display module in an electronic device according to various example embodiments.

FIG. 5 is a simple exploded perspective view mainly illustrating a display module in an electronic device according to various embodiments.

Referring to FIG. 5, an electronic device 400 may include a front housing 410 having an opening, a hardware part 470 disposed in the front housing 410, a support member 460 covering at least part of the hardware part 470, a rear case 490 shielding at least part of the opening on a first side of the front housing 410, a sensor module 492 disposed adjacent to the rear case 490, and a display module 420 disposed to cover at least part of the opening on a second side of the front housing 410 and providing visual information to a user.

In the embodiment of FIG. 5, all or part of the description of the side bezel structure 206 or 310 of FIG. 2 or FIG. 4 may be applied adaptively to the front housing 410. The hardware part 470 may refer to a configuration including one or more electronic components, and include all or some of the various electronic components (e.g., the battery 370, the PCB 380, the first antenna 350, and/or the second antenna 355) described with reference to FIG. 4. The description of the support member 360 of FIG. 4 may be applied adaptively to the support member 460. The description of the rear plate 393 of FIG. 4 may be applied adaptively to the rear case 490. The description of the sensor module of FIG. 1 (e.g., the sensor module 176 of FIG. 1) and/or the sensor module of FIGS. 2 and 3 (the sensor module 211 of FIG. 2 or FIG. 3) may be applied adaptively to the sensor module 492.

According to various embodiments, the display module 420 may be coupled, directly or indirectly, with the front housing 410. In an embodiment, the display module 420 may be attached to an edge area of the front housing 410 via an adhesive member (e.g., an adhesive member 599 of FIG. 9). In attaching the display module 420 to the front housing 410, a bonding force between the display module 420 and the front housing 410 may be increased by adjusting an application position, an application amount, and/or an application height of the adhesive member 599. Further, the size of a display panel included in the display module 420 may be increased, and a better field of view may be provided to the user, by subdividing a partial structure of the display module 420 coupled with the front housing 410. A display structure (e.g., a display structure 501 of FIG. 9) which may provide the above-described effects and various other technical advantages will be described below. While for convenience of description, the display structure 501 may be described as disposed between at least a display module (e.g., the display module 420 or 500 of FIG. 5 or FIG. 6) and a front housing (e.g., a front housing 510 of FIG. 9), the disclosure is not necessarily limited thereto, and various implementation modifications may be made without departing from the spirit of the disclosure.

Figure 6:
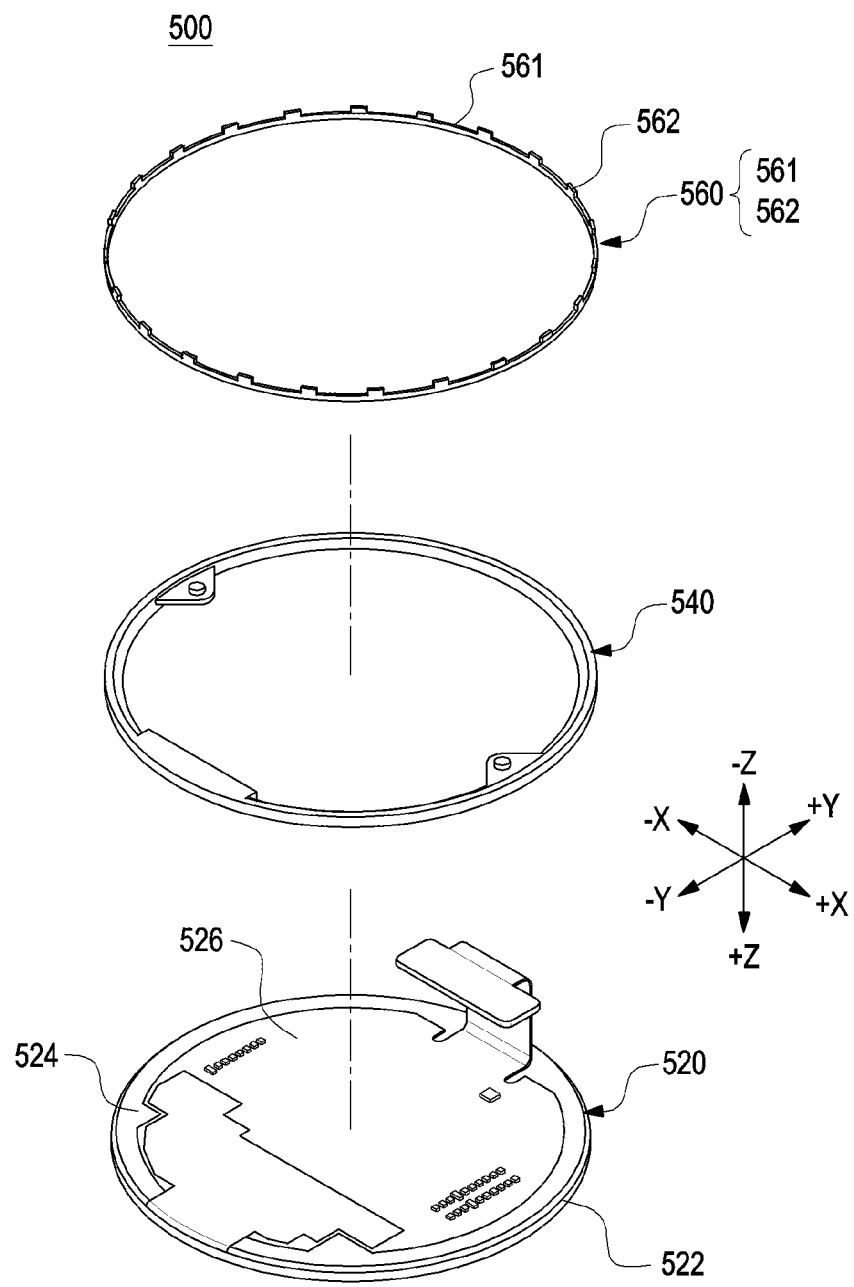
FIG. 6 is an exploded perspective view illustrating a display module according to various example embodiments.
Figure 7:
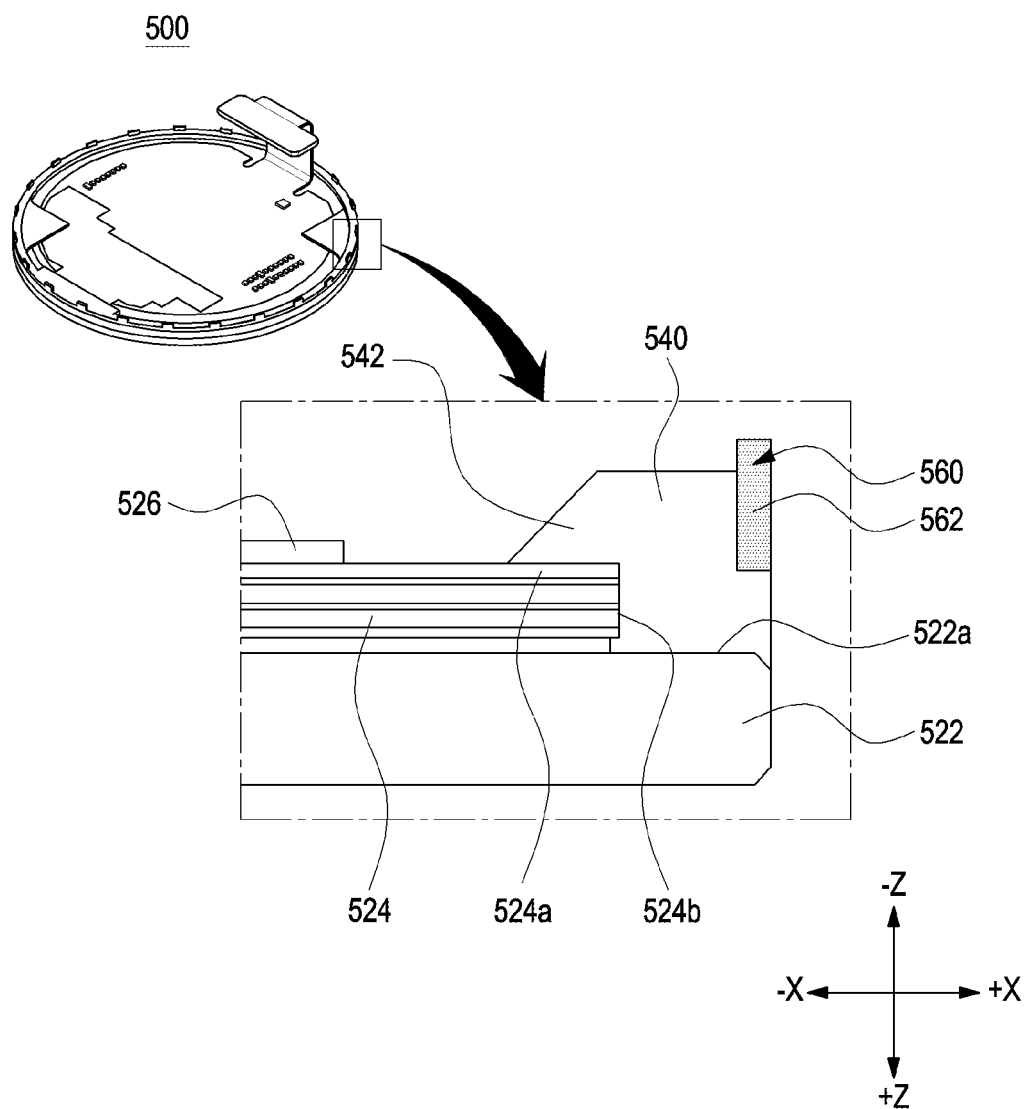
FIG. 7 is a diagram illustrating a display module and a cross-section of the display module according to various example embodiments.
Figure 8:
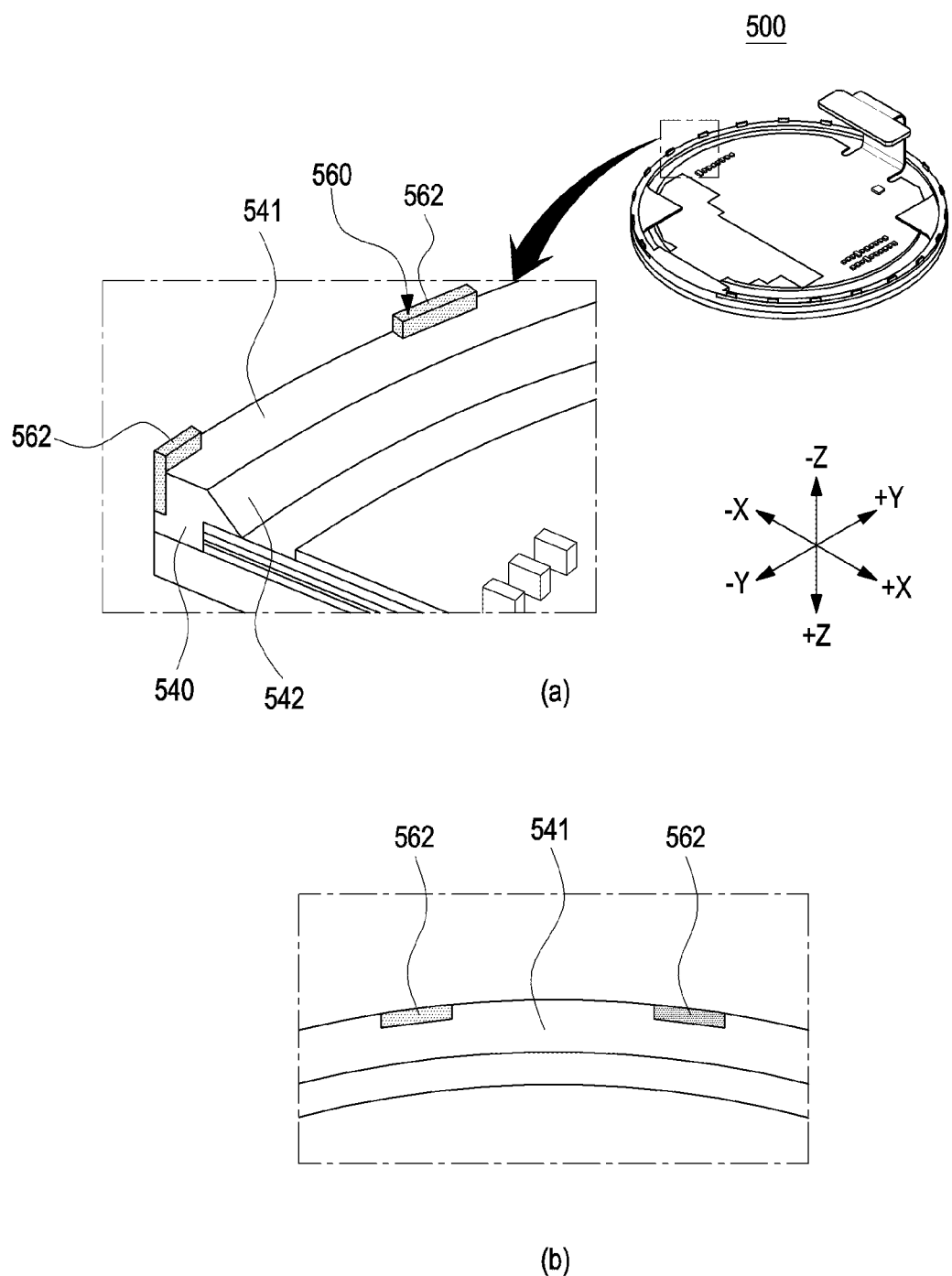
FIG. 8(a)-8(b) are diagrams illustrating a display module observed from various angles according to various example embodiments.
Figure 9:
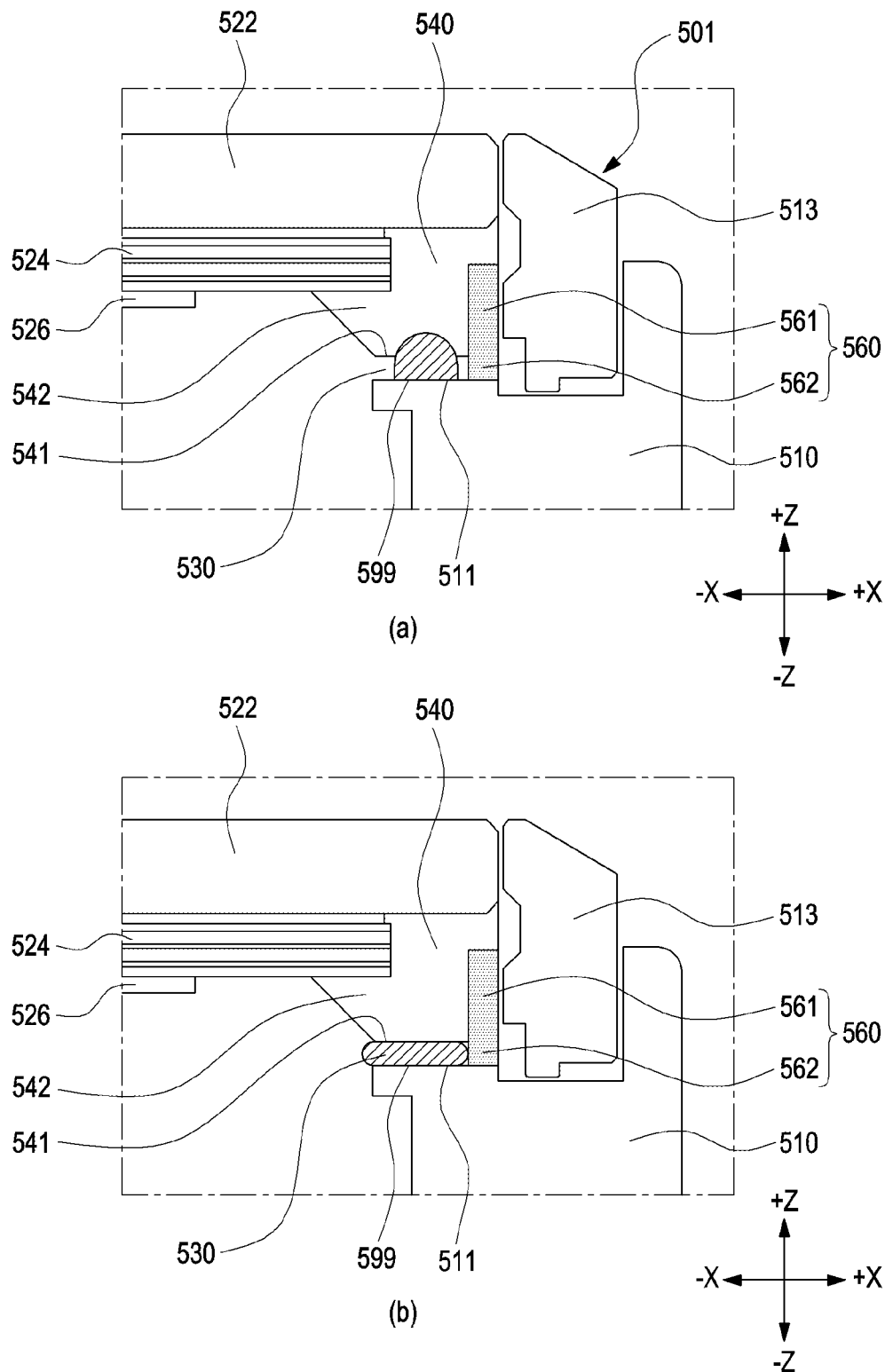
FIGS. 9(a)-9(b) are diagrams illustrating a process of combining a display structure according to various example embodiments.

FIG. 6 is an exploded perspective view illustrating a display module according to various embodiments. FIG. 7 is a diagram illustrating the display module and a cross-section of the display module according to various embodiments. FIG. 8 is a diagram illustrating the display module observed from various angles according to various embodiments. FIG. 9 is a diagram illustrating a process of combining a display structure according to various embodiments.

Referring to FIGS. 6 to 9, the display structure 501 (see FIG. 9) may include a front housing (e.g., the front housing 510 of FIG. 9) and the display module 500. In describing FIGS. 6 to 9, the description of the front housing 410 of FIG. 5 may be applied adaptively to the front housing 510. In addition, the description of the display module 420 of FIG. 5 may be applied adaptively to the display module 500.

According to various embodiments (referring to FIG. 6), the display module 500 may include a display 520, a stopper 560, and a base 540 for coupling the display 520 with the stopper 560. In an embodiment, the stopper 560 may be coupled with the display 520 through an injection process. For example, the stopper 560 may be insert-injected into the base 540 to be coupled with the display 520. A process of manufacturing the display part 520 will be described later.

According to various embodiments, the display 520 may include a window 522, a display panel 524 disposed on the window 522, and a circuit board 526 disposed on the display panel 524 and electrically connected, directly or indirectly, to the display panel 524. In an embodiment, the circuit board 526 may include a flexible PCB (FPCB).

According to various embodiments, the base member 540 may be disposed in an edge area of the display part 520. The shape of the base member 540 may correspond to that of the window 522. For example, the base member 540 may be identical or similar to the window 522 in shape so as to be disposed along the periphery of the window 522. In an embodiment, the base member 540 may be disposed to overlap with at least part of the window 522, the display panel 524, and/or the circuit board 526. The base member 540 may be disposed along the edge area of the display part 520 and connect, directly or indirectly, the stopper 560 to the display part 520.

According to various embodiments, the stopper 560 may include a support 561 and a protrusion 562 protruding from the support 561. In an example, a plurality of protrusions 562 may protrude from at least a partial area of the support 561. The plurality of protrusions 562 may be disposed at predetermined intervals, which should not be construed as limiting. Further, a single protrusion 562 may be formed. In a certain embodiment, the stopper 560 and the support 561 may be formed without distinction between them (e.g., such that the areas of the protrusion 562 and the support 561 are the same). This will be described later with reference to FIGS. 11A to 11C. In an embodiment, at least a part (e.g., the support 561) of the stopper 560 may be disposed within the base member 540, and another part (e.g., the projection 562) of the stopper 560 may protrude from the base member 540.

In an embodiment, the shape of the stopper 560 may correspond to that of the window 522, and/or the shape of the stopper 560 may correspond to that of the base member 540. At least a partial area of the window 522 may be transparent to provide a field of view to the user, and may be circular or polygonal. In a certain embodiment, the stopper 560 may be shaped into a closed curve (e.g., see FIG. 11B). For example, the support 561 may be shaped into a circular ring. Alternatively, the support 561 may be shaped into a polygon. When the support 561 is polygonal, the corners of the support 561 may be rounded.

According to various embodiments (referring to FIG. 7), the base member 540 may cover partial areas of the window 522 and the display panel 524. For example, at least part of the base member 540 may cover an edge area 522a of the window 522, a side edge area 524b of the display panel 524, and a bottom edge area 524a of the display panel 524. In other words, the base member 540 may include a cover area 542 for covering the edge area 522a of the window 522, and the side edge area 524b and the bottom edge area 524a of the display panel 524.

According to various embodiments (referring to FIG. 8), the display module 500 may include a bonding part 541. For example, the bonding part 541 may refer to one surface of the base member 540 adjacent to the cover area 542. Alternatively, the bonding part 541 may refer to an area of the base member 540 protruding in a direction (−z-axis direction) toward the front housing 510. In an embodiment, the protrusion 562 may be disposed adjacent to (or on) the bonding part 541. For example, as described above, a part (e.g., the support 561) of the stopper 560 may be insert-injected into the base member 540, whereas another part (the protrusion 562) may protrude outward from the bonding part 541. In an embodiment, the bonding part 541 may serve as an area in which the adhesive member 599 is to be applied. The bonding part 541 may have a flat surface for this purpose. Alternatively, to strengthen the bonding force, the surface of the bonding part 541 may be processed (e.g., to form a concavo-convex pattern). In this regard, the description of FIG. 27 may be applied adaptively. For example, an embodiment in which a surface 1961a of a sheet 1961 is processed in FIG. 27 may be applied to the bonding part 541 in the same or similar manner. In an embodiment, the adhesive member 599 may be applied to the bonding part 541 except for an area occupied by the protrusion 562, and to change the application area of the adhesive member 599, the size of the protrusion 562 may be adjusted.

According to various embodiments, the front housing 510 may include a bonding area 511. The bonding area 511 may refer to a partial area of the front housing 510 facing the bonding part 541. The bonding area 511 may serve as an area in which the adhesive member 599 is to be applied, and have a flat surface or a processed surface as described above. In a certain embodiment, the front housing 510 may include a wall-shaped bezel part 513, and the display module 500 may be inserted inside the bezel part 513.

According to various embodiments, the protrusion 562 may provide a bonding space 530 which is a gap space defined between at least the bonding part 541 and the bonding area 511. For example, as the protrusion 562 protrudes a predetermined distance from the bonding part 541, when an end of the protrusion 562 contacts the front housing 510 (e.g., the bonding area 511), the bonding area 511 and the bonding part 541 may be spaced apart from each other by the distance at which the protrusion 562 protrudes from the bonding part 541.

In an embodiment, the display structure 501 may maintain the distance between the bonding part 541 and the bonding area 511 via the protrusion 562. Due to the protrusion 562, the height of the bonding space 530 may be kept constant, and the adhesive member 599 may be uniformly applied during manufacturing of the display module 500. Accordingly, the display part 520 may reduce a step difference from the front housing 510 and be uniformly disposed in the front housing 510. In addition, in the case of manufacturing a plurality of electronic devices, the display module 500 may be bonded in each of the plurality of electronic devices by an adhesive member applied to a uniform bonding section (e.g., the bonding space 530), thereby reducing variations between the plurality of products.

In terms of the manufacturing process, the display part 520 may be disposed in the front housing 510 such that the adhesive member 599 is disposed in the bonding area 511 and then comes into contact with the bonding part 541 (FIG. 9(a)). In this process, the adhesive member 599 may be pressed to be spread evenly in the bonding space 530, and the bonding part 541 and the bonding area 511 may be stably coupled with each other.

Figure 10:
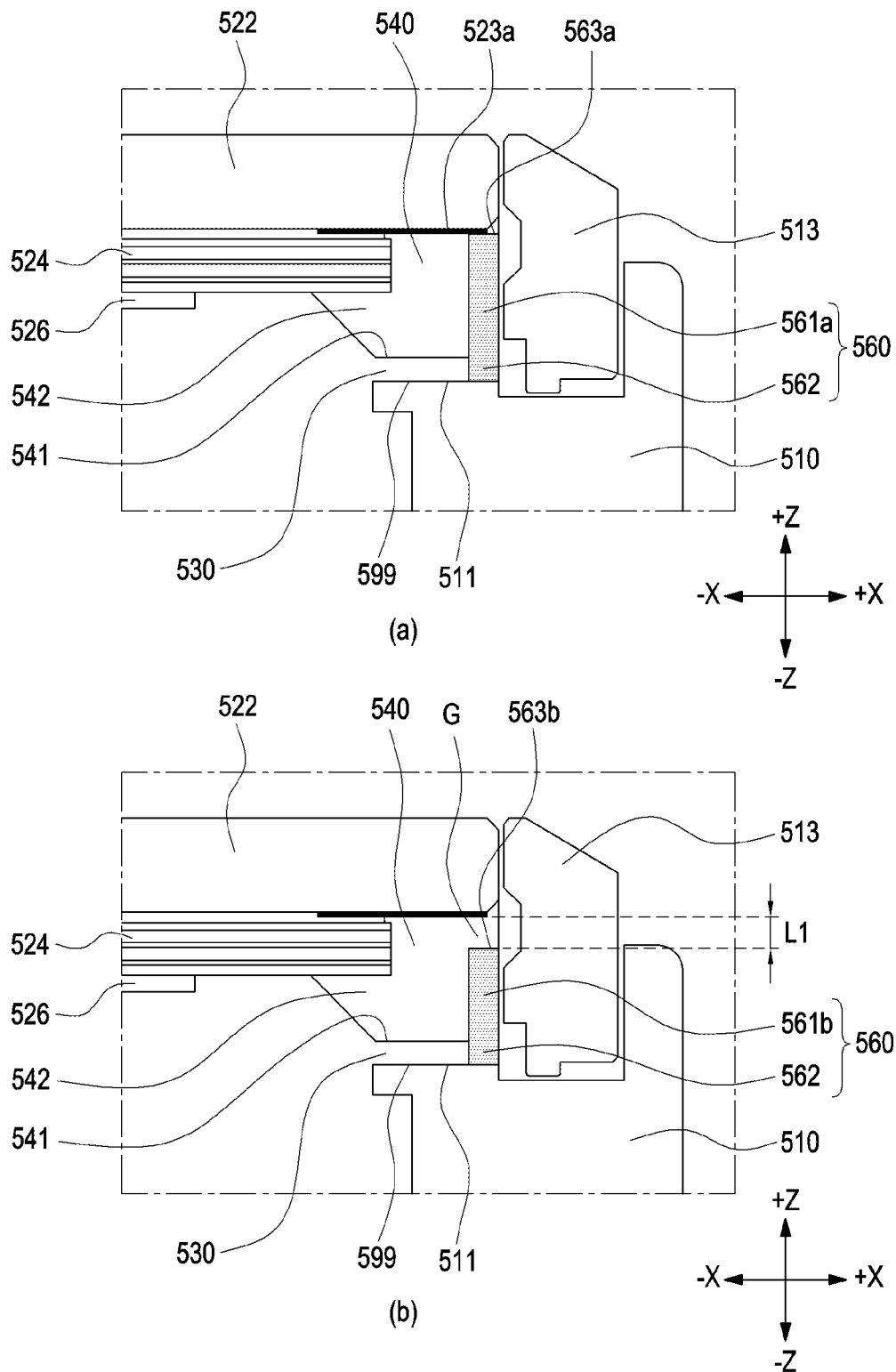
FIGS. 10(a)-10(b) are diagrams illustrating an arrangement of a display structure according to another example embodiment.

FIG. 10 is a diagram illustrating an arrangement relationship between a display structure and a housing according to another embodiment.

In describing FIG. 10, the description of the display structure 501 including the display module 500 and the front housing 510 illustrated in FIGS. 6 to 9 may be applied adaptively. Further, reference numerals in FIGS. 6 to 9 may be equally applied to FIG. 10.

According to various embodiments (referring to FIG. 10(a)), one end 563a of a support 561a may be disposed to at least partially contact the window 522. As the one end 563a of the support 561a contacts the window 522, the stopper 560 may be supported by the window 522, and the position of the stopper 560 may be stably maintained. In an embodiment, the window 522 may include a contact area 523a for contacting the one end 563a of the support 561a. In order to reduce damage to the window 522 by the stopper 560, the contact area 523a may be separately coated. In an embodiment, a reinforcing coating may be applied to the contact area 523a to reinforce the surface of the window 522. For example, a thin film including a polymer material may be coated on the contact area 523a.

According to various embodiments (referring to FIG. 10(b)), one end 563b of a support 561b may be disposed to be spaced apart from the window 522 by a predetermined distance. In other words, a gap G may be formed between at least the one end 563b of the support 561b and the window 522, and the base member 540 may be disposed in the gap G. In an embodiment, the stopper 560 may be formed of a hard metal material, and the gap G formed to be as large as a predetermined distance L1 may reduce stamping on or damage to the window 522 caused by the support 561b. Further, in a certain embodiment, the stopper 560 may be manufactured by processing (e.g., trimming, etching, and bending) a metal material (e.g., STS) or injecting a polymer material, which may increase the strength of the stopper 560.

A display structure including the gap G (e.g., the display structure 501 of FIG. 9) will be mainly described. However, this is only for convenience of description, and the spirit of the disclosure is not to be construed as being limited to these examples. In other words, it will be understood that all example embodiments described above and below are equally or similarly applicable to a display structure in which the one end 563a of the stopper 560 described in FIG. 10(a) is in contact with the window 522.

Figure 11A:
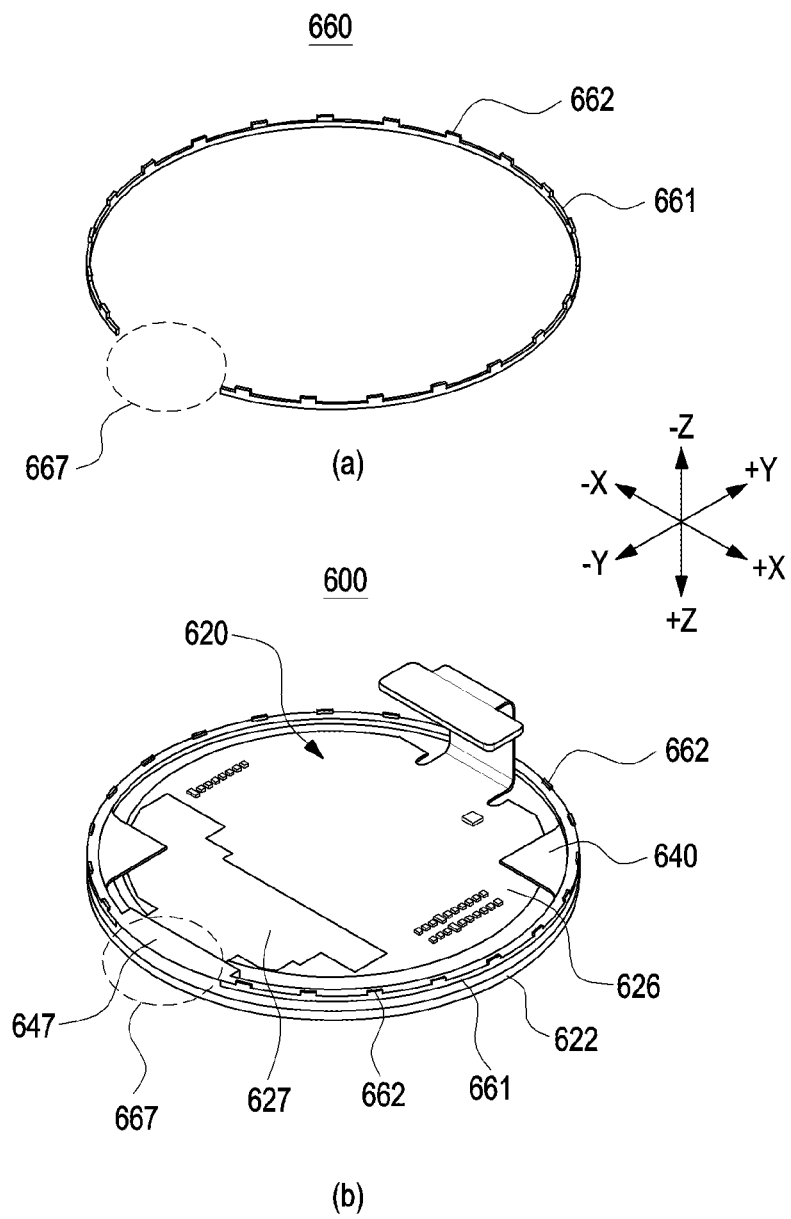
FIGS. 11A(a)-(b) are diagrams is a diagram illustrating a stopper and a display module in which the stopper is disposed according to an example embodiment.
Figure 11B:
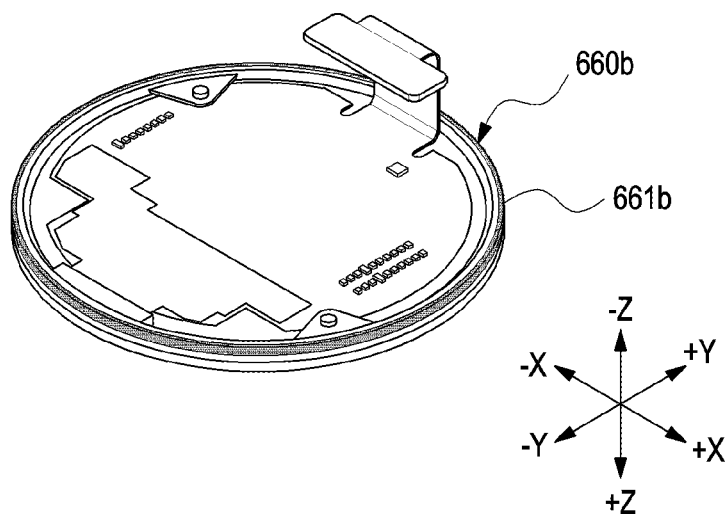
FIG. 11B is a diagram illustrating a stopper and a display module in which the stopper is disposed according to another example embodiment.
Figure 11C:
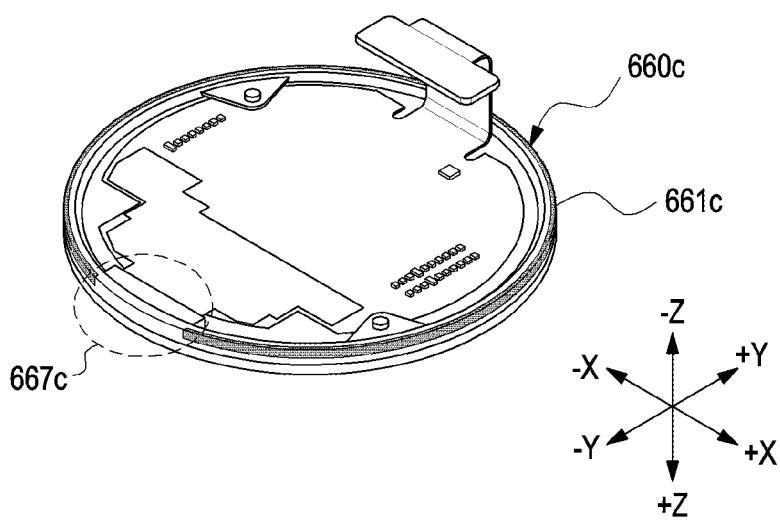
FIG. 11C is a diagram illustrating a stopper and a display module in which the stopper is disposed according to another example embodiment.
Figure 12:
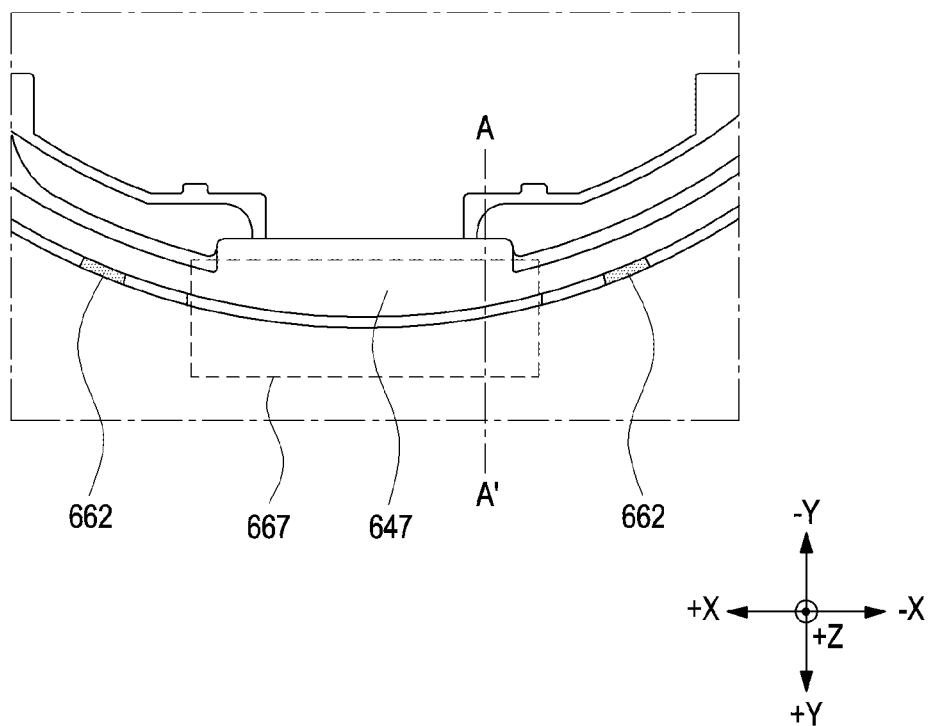
FIG. 12 is an enlarged view illustrating a partial area of the display structure of FIG. 11A.
Figure 13:
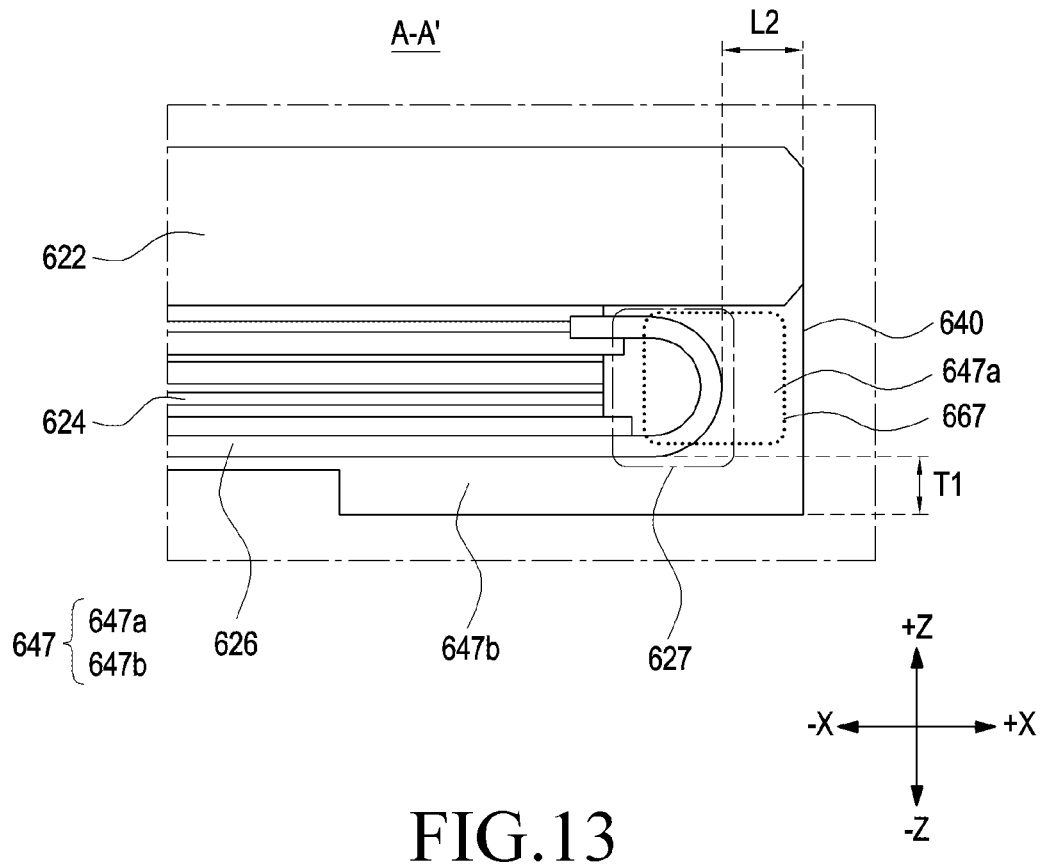
FIG. 13 is a diagram illustrating a cross section A-A' of FIG. 12.

FIG. 11A is a diagram illustrating a stopper and a display module (comprising a display) in which the stopper is disposed according to an embodiment. FIG. 11B is a diagram illustrating a stopper and a display module in which the stopper is disposed according to another embodiment. FIG. 11C is a diagram illustrating a stopper and a display module in which the stopper is disposed according to another embodiment. FIG. 12 is an enlarged view illustrating a partial area of the display structure of FIG. 11A. FIG. 13 is a diagram illustrating a cross section A-A' of FIG. 12.

Referring to FIGS. 11A to 13, a display module 600 may include a stopper 660 in which at least a partial area is opened. Unless otherwise mentioned, the description of the display module 500 and the stopper 560 of FIGS. 6 to 10 may be applied adaptively to the display module 600 and the stopper 660 of FIGS. 11A to 13.

According to various embodiments, a display part 620 may include a panel bending area 627 in at least part thereof. In an embodiment, the panel bending area 627 may refer to an area in which part of a display panel 626 is folded. A circuit board 624 may be disposed adjacent to the display panel 626, which should not be construed as limiting. In regard to arrangement of the display part 620 having the panel bending area 627, the display module 600 may include a structure for space efficiency and expansion of a display field of view.

According to various embodiments (referring to FIGS. 12 and 13), a base member 640 may include a cover area 647 corresponding to at least part of the panel bending area 627. The cover area 647 may be formed on an outer part of the base member 640, and the display part 620 and the base member 640 may be disposed such that the panel bending area 627 is located in the cover area 647. In an embodiment, the cover area 647 may include a first cover area 647a covering a side surface (+x-axis direction) of the panel bending area 627 and a second cover area 647b covering a bottom surface (−z-axis direction) of the panel bending area 627. In an embodiment, the first cover area 647a may have a first side area L2. For example, the first side area L2 may be, but not limited to, about 0.4 mm or larger. As the first side area L2 becomes smaller, the area of the display panel 626 may be increased, which may provide a wider display field of view to the user. Alternatively, the area of a window 622 covering the base member 640 and/or the area of the display panel 626 disposed inside the base member 640 may be changed according to a change in the first side area L2. In an embodiment, the second cover area 647b may have a first lower thickness T1. For example, the first lower thickness T1 may be, but not limited to, about 0.25 mm or larger. In an embodiment, the second cover area 647b may cover from the panel bending area 627 to a partial unbent area inside (−x-axis direction) the display panel 626.

According to various embodiments, the stopper 660 may include an opening area 667. The stopper 660 may be disposed inside the base member 640 such that the opening area 667 is located to overlap with the cover area 647 and/or the panel bending area 627. As described above, the first side area L2 needs to be reduced to increase the area of the display panel 626, and for this purpose, the opening area 667, which is an open partial area (without either of a support part 661 and a protrusion 662) of the stopper 660, may be located in the cover area 647. For example, as the panel bending area 627 is accommodated in the opening area 667, the panel bending area 627 may be disposed closer to an edge of the window 622. In an embodiment, as the panel bending area 627 is disposed closer to the edge of the window 622, the first side area L2 may be reduced, and the area of the display panel 626 may be increased by as much as the decrement of the first side area L2. In other words, it may be said that the stopper 660 is not disposed in the cover area 647, and thus the first side area L2 may be reduced. However, for a purpose included in the spirit of disclosure in addition to this purpose, for example, for the efficiency of a manufacturing process, the opening area 667 may be formed in the stopper 660. In a certain embodiment, at least part of the cover area 647 may be processed to have a function similar to the stopper 660. For example, a protrusion may formed to face a front housing (e.g., a bonding area of the front housing 510 of FIG. 10 (e.g., the bonding area 511 of FIG. 10)) in at least part of the cover area 647, which enables achievement of the function and purpose of the stopper 660 even in the cover area 627 in which the stopper 660 is not disposed.

In a certain embodiment (referring to FIGS. 11B and 11C), stoppers 660*b* and 660*c* may include support parts 661*b* and 661*c* in which a protrusion (e.g., the protrusion 662 of FIG. 11A) and a support part (e.g., the support part 661 of FIG. 11A) are integrated. For example, the stoppers 660*b* and 660*c* may include protrusions continuous in shape over the entirety of the support parts 661*b* and 661*c*. In an embodiment, the stoppers 660*b* and 660*c* of FIGS. 11B and 11C may implement a function provided by the protrusion 662 of FIG. 11A through their shapes, without including separate protrusions (e.g., the protrusion 662 of FIG. 11A). For example, at least parts of areas of the support parts 661*b* and 661*c* on one side thereof (in the −z-axis direction) may provide the function of the protrusion (e.g., the protrusion 662 of FIG. 11A). In other words, it may be said that the protrusion (e.g., the protrusion 662 of FIG. 11A) of the above-described embodiments is formed over all areas of the support parts 661*b* and 661*c*. For example, the support parts 661*b* and 661*c* of FIGS. 11B and 11C may be formed thicker in a vertical direction (z-axis direction) than the support parts (e.g., the support part 661 of FIG. 11A) of the above-described embodiments. In another example, the support parts 661*b* and 661*c* of FIGS. 11B and 11C may perform substantially the same function as the protrusion (e.g., the protrusion 662 of FIG. 11A) of the above-described embodiments. In a certain embodiment (referring to FIG. 11B), the stopper 660*b* may be shaped into a closed curve without including a separate opening area (e.g., the opening area 667 of FIG. 11A). In a certain embodiment (referring to FIG. 11C), the stopper 660*c* may be formed to include an opening area 667*c*, while the protrusion (e.g., the protrusion 662 of FIG. 11A) and the support part 661*c* are integrated.

Figure 14:
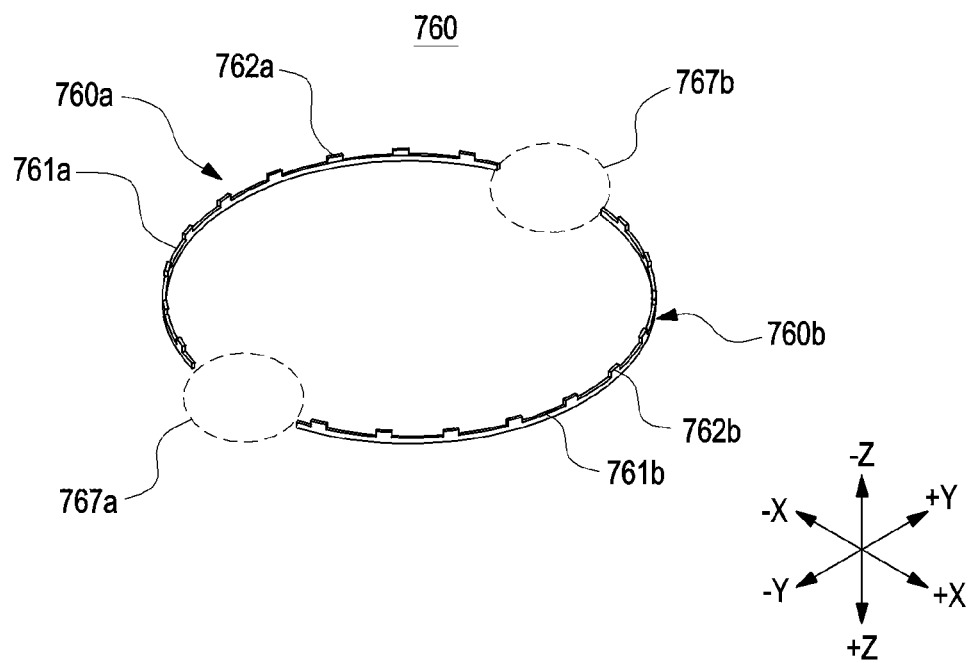
FIG. 14 is a diagram illustrating a stopper according to another example embodiment.

FIG. 14 is a diagram illustrating a stopper according to another embodiment.

Referring to FIG. 14, a stopper 760 may include a first stopper 760*a* and a second stopper 760*b*. The first stopper 760*a* and the second stopper 760*b* may include a first support part 761*a* and a second support part 761*b*, respectively. In other words, the stopper 760 may be formed to have a plurality of separate support parts 761*a* and 761*b*. Unless otherwise mentioned, the description of the stopper 560 of FIGS. 6 to 10 and the stopper 660 of FIGS. 11A to 13 may be wholly or partially applied adaptively to the stopper 760 of FIG. 14.

According to various embodiments, the stopper 760 may include the first support part 761*a* and the second support part 761*b*. Although the stopper 760 is shown as divided into two support parts 761*a* and 761*b* by way of example, the stopper 760 may be divided into three or more support parts. As described before, one or more first protrusions 762*a* may be formed on the first supporting part 761*a*, and one or more second protrusions 762*b* may be formed on the second support part 761*b*. As the stopper 760 is divided into the plurality of support parts 761*a* and 761*b*, the stopper 760 may include a plurality of opening areas 767*a* and 767*b*. The number of the opening areas 767*a* and 767*b* may vary according to the number of the divided support parts 761*a* and 761*b*. In other words, it may be said that gap spaces between the plurality of divided support parts 761*a* and 761*b* may be provided as the opening areas 767*a* and 767*b*. The description of the foregoing opening area (e.g., the opening area 667 of FIGS. 11A to 13) may be applied adaptively to the plurality of opening areas 767*a* and 767*b*. According to various embodiments, as the stopper 760 is divided into the plurality of support parts 761*a* and 761*b*, a bending process may be simplified, and shape processing may be facilitated during manufacturing of the stopper 760, thereby increasing manufacturing efficiency.

Figure 15:
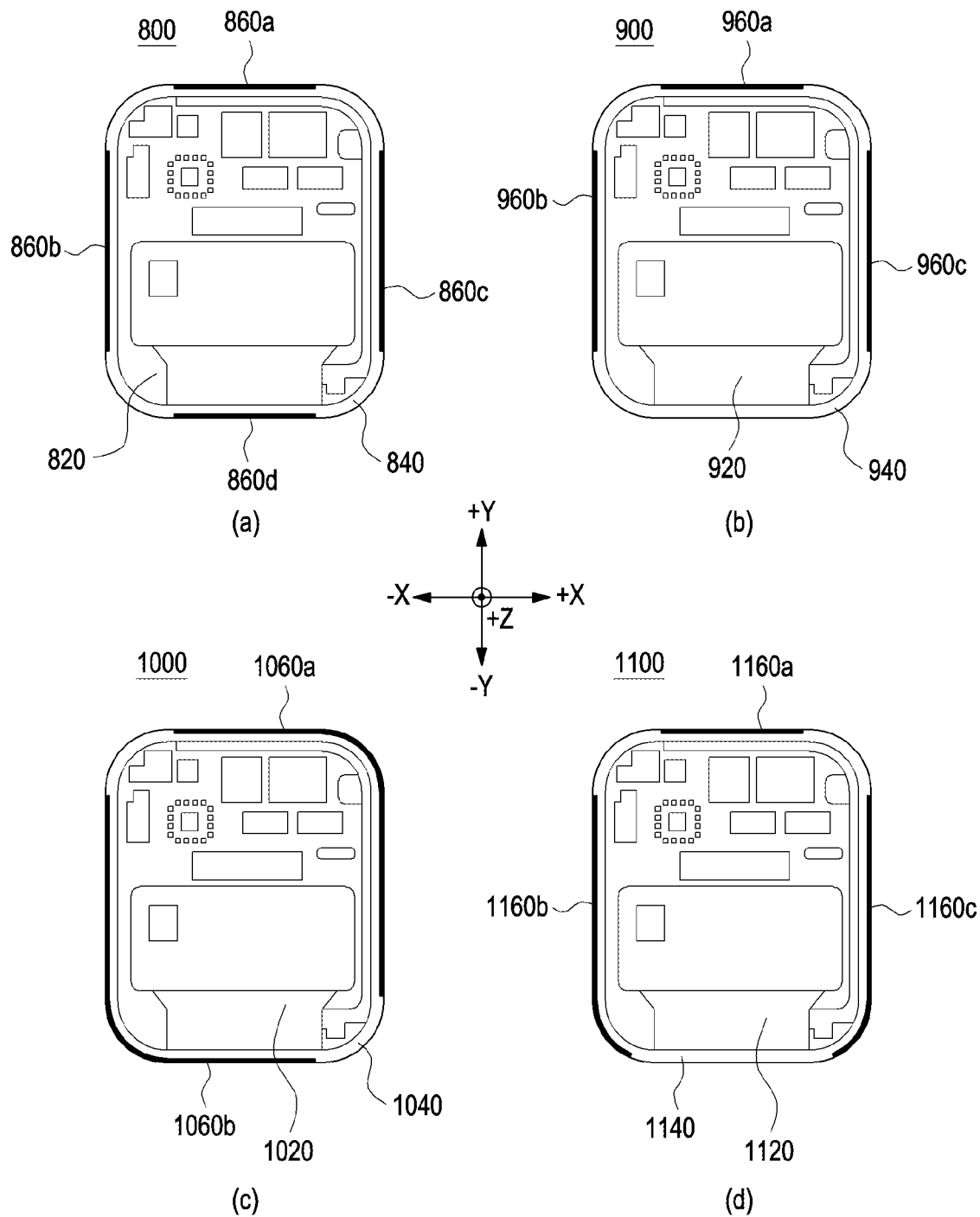
FIGS. 15(a)-15(d) are diagrams is a diagram illustrating various implementation examples of a display module according to another example embodiment.

FIG. 15 is a diagram illustrating various implementation examples of a display structure according to another embodiment.

Referring to FIG. 15, display modules 800, 900, 1000, and 1100 according to various embodiments may be polygonal in shape, and each comprise a display. For example, as described above, the display modules 800, 900, 1000 and 1100 may be shaped into a polygon with rounded corner areas. Unless otherwise mentioned, the description of the display modules 500 and 600 in the above-described embodiments may be applied adaptively to the various display modules 800, 900, 1000, and 1100 illustrated in FIG. 15.

According to various embodiments (referring to (a)), the display module 800 may include four divided stoppers 860*a*, 860*b*, 860*c*, and 860*d*. In an embodiment, each of the stoppers 860*a*, 860*b*, 860*c*, and 860*d* may be disposed in a straight area (not a corner) of a display part 820 or a base member 840. As the plurality of stoppers 860*a*, 860*b*, 860*c*, and 860*d* are in the shape of straight lines, a stopper manufacturing process may be simplified.

According to various embodiments (referring to (b)), a display module 900 may include stoppers 960*a*, 960*b*, and 960*c* disposed only in partial areas. For example, a stopper may not be disposed in some edge area of a display part 920 or a base member 940. As described above, the partial area of the display module 900 in which no stopper is disposed may be a panel bending area (e.g., the panel bending area 627 of FIG. 13). In other words, when a stopper is divided into the plurality of stoppers 960*a*, 960*b*, and 960*c*, the plurality of stoppers 960*a*, 960*b*, and 960*c* may be disposed only in the remaining straight areas or corner areas of the display part 920 or the base member 940 except for the panel bending area (e.g., the panel bending area 627 of FIG. 13). In a certain embodiment, the remaining area of the base member 940 in which the stoppers 960*a*, 960*b*, and 960*c* are not disposed may be processed to be in a shape similar to that of the stoppers 960*a*, 960*b*, and 960*c*. For example, at least part of the remaining area of the base member 940 may protrude toward a front housing (e.g., the front housing 510 of FIG. 10).

According to various embodiments (referring to (c)), a display module 1000 may include a plurality of bent stoppers 1060*a* and 1060*b*. For example, the plurality of bent stoppers 1060*a* and 1060*b* may be disposed in corner areas and straight areas adjacent to the corner areas on a display part 1020 or a base member 1040.

According to various embodiments (referring to (d)), a display module 1100 may include a plurality of stoppers 1160*a*, 1160*b*, and 1160*c*, some of which are in the shape of straight lines, and others of which are bent. For example, the stopper 1160*a* in the shape of a straight line may be disposed in a straight area of a display part 1120 or a base member 1140, and the partially bent stoppers 1160*b* and 1160*c* may be disposed in corner areas and straight areas adjacent to the corner areas on the display part 1120 or the base member 1140.

It will be understood that in addition to the illustrated embodiments, the stopper may have various shapes or may be divided into various numbers of stoppers. In addition, a plurality of stoppers may be disposed at various positions of a display module.

Figure 16:
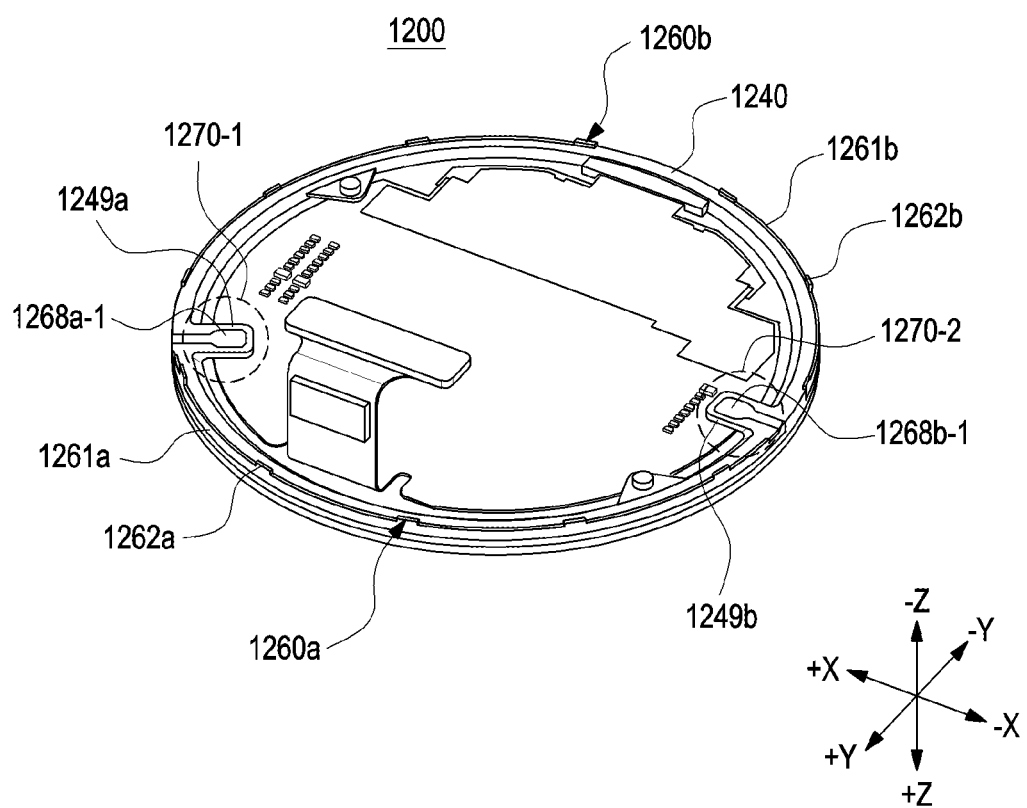
FIG. 16 is a diagram illustrating a display module including a conductive area according to various example embodiments.

FIG. 16 is a diagram illustrating a display structure including a conductive area, according to various embodiments.

Referring to FIG. 16, a display module 1200 may include conductive areas 1270-1 and 1270-2. The descriptions of the display modules 500, 600, 800, 900, 1000, and 1100 in the above-described embodiments may be applied adaptively to the display module 1200 of FIG. 16. Each display module herein comprises a display.

According to various embodiments, the display module 1200 may include the conductive areas 1270-1 and 1270-2 extending inward. In an embodiment, a partial area of a first stopper 1260*a* may be bent and disposed inside the display module 1200, and when the first stopper 1260*a* is formed of a conductive metal material, one end area of the first stopper 1260*a* bent and extending from a first support part 1261*a* may serve as a first conductive portion 1268*a*-1. As described above, the display module 1200 may include the divided first stopper 1260*a* and second stopper 1260*b*, and the description of the first stopper 1260*a* may be applied equally or symmetrically to the second stopper 1260*b*. For example, one end area of the second stopper 1260*b* may serve as a second conductive part 1268*b*-1.

According to various embodiments, the base member 1240 may include a first accommodation area 1249*a* and a second accommodation area 1249*b* that may accommodate the first conductive part 1268*a*-1 and the second conductive part 1268*b*-1. The first accommodation area 1249*a* and the second accommodation area 1249*b* may extend to an inner area of the base member 1240. In an embodiment, the first conductive part 1268*a*-1 may be insert-injected into the first accommodation area 1249*a*, and the second conductive part 1268*b*-1 may be insert-injected into the second accommodation area 1249*b*.

According to various embodiments, the first conductive part 1268*a*-1 and/or the second conductive part 1268*b*-1 may be connected, directly or indirectly, to a ground or a circuit board (e.g., the PCB 380 of FIG. 4), and improve electrostatic discharge (ESD). Alternatively, the first conductive part 1268*a*-1 and the second conductive part 1268*b*-1 may be provided as antennas.

Figure 17:
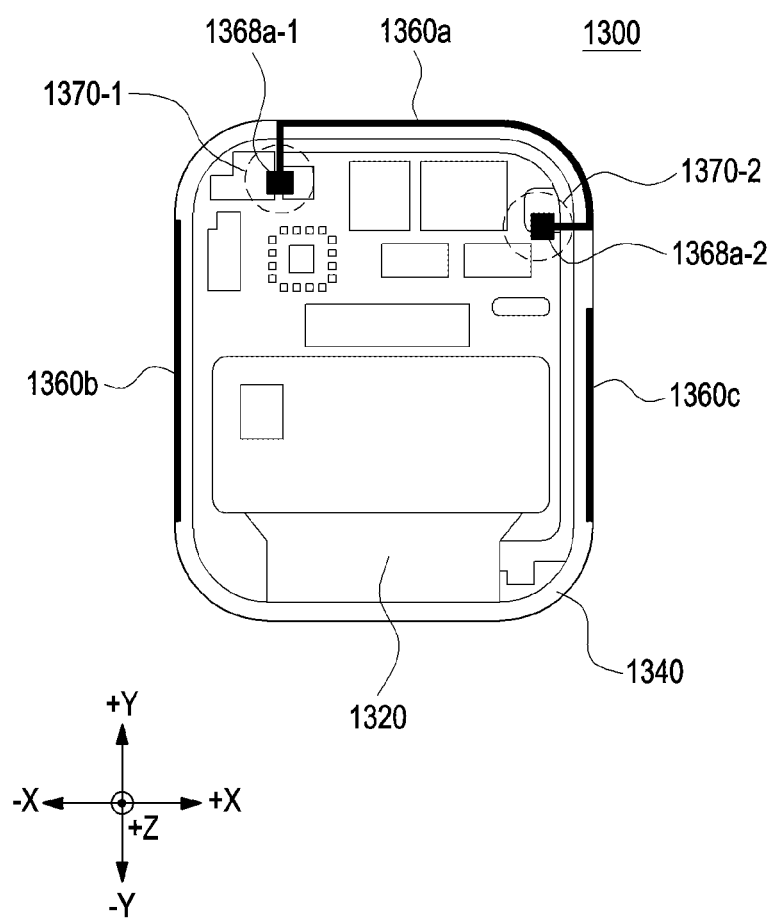
FIG. 17 is a diagram illustrating a display module including a conductive area according to another example embodiment.

FIG. 17 is a diagram illustrating a display structure including a conductive area according to another embodiment.

Referring to FIG. 17, a display module 1300 in the shape of a polygon may include a plurality of stoppers 1360*a*, 1360*b*, and 1360*c* including conductive parts 1368*a*-1 and 1368*a*-2. Unless otherwise mentioned, the description of the display module 1300 of FIG. 16 may be applied adaptively to the display module 1300 of FIG. 17.

According to various embodiments, the display module 1300 may include the first conductive area 1370-1 and the second conductive area 1370-2. Similarly to the above description, the first conductive part 1368*a*-1 and the second conductive part 1368*a*-2 may be disposed in the first conductive area 1370-1 and the second conductive area 1370-2, respectively.

According to various embodiments, the first stopper 1360*a* including the first conductive part portion 1368*a*-1 and the second conductive part 1368*a*-2 may be disposed in a corner and part of a straight area on the display part 1320 or the base member 1340, and the second stopper 1360*b* and the third stopper 1360*c* may be disposed in the remaining area of the display part 1320 or the base member 1340. For the arrangement relationship of the first stopper 1360*a*, the second stopper 1360*b*, and the third stopper 1360*c*, the descriptions of the arrangement structures of a plurality of stoppers in the above-described embodiments may be applied adaptively, and a redundant description will be avoided.

Figure 18:
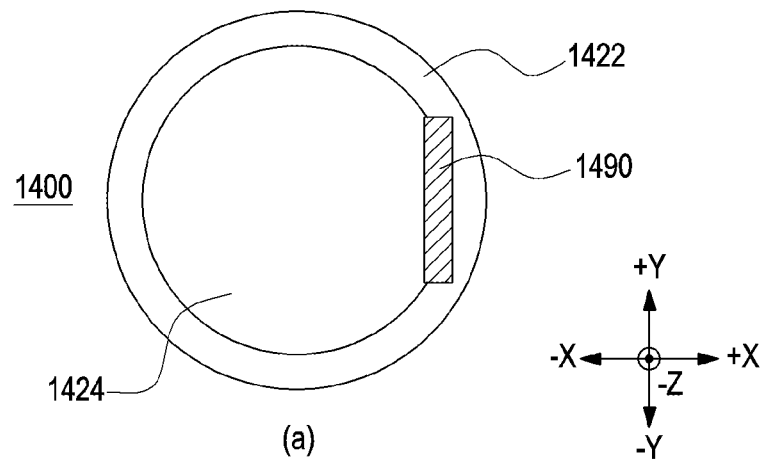
FIGS. 18(a)-18(c) are diagrams is a diagram illustrating a display module including a communication module according to various example embodiments.
Figure 18:
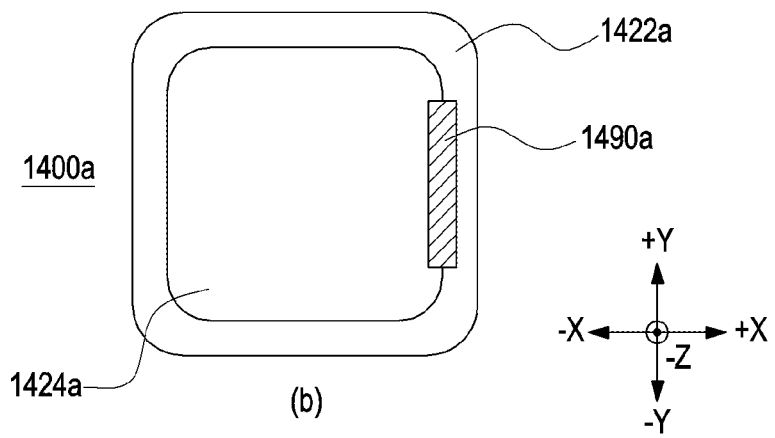
Figure 18:
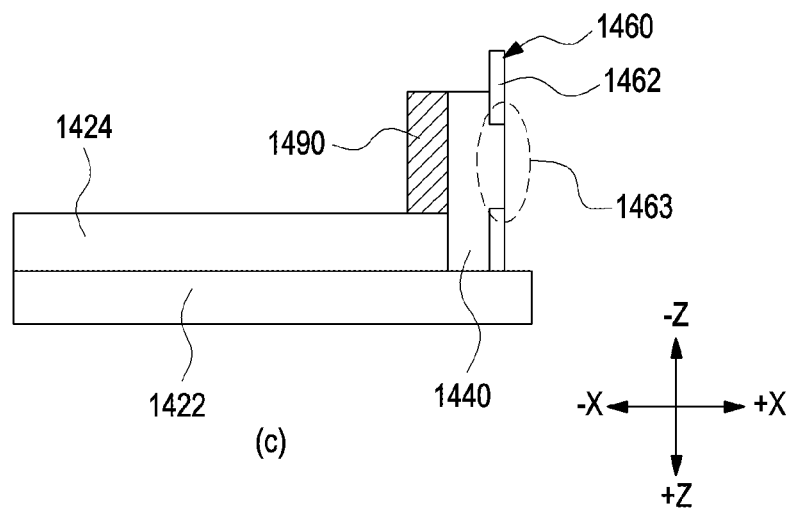
Figure 19:
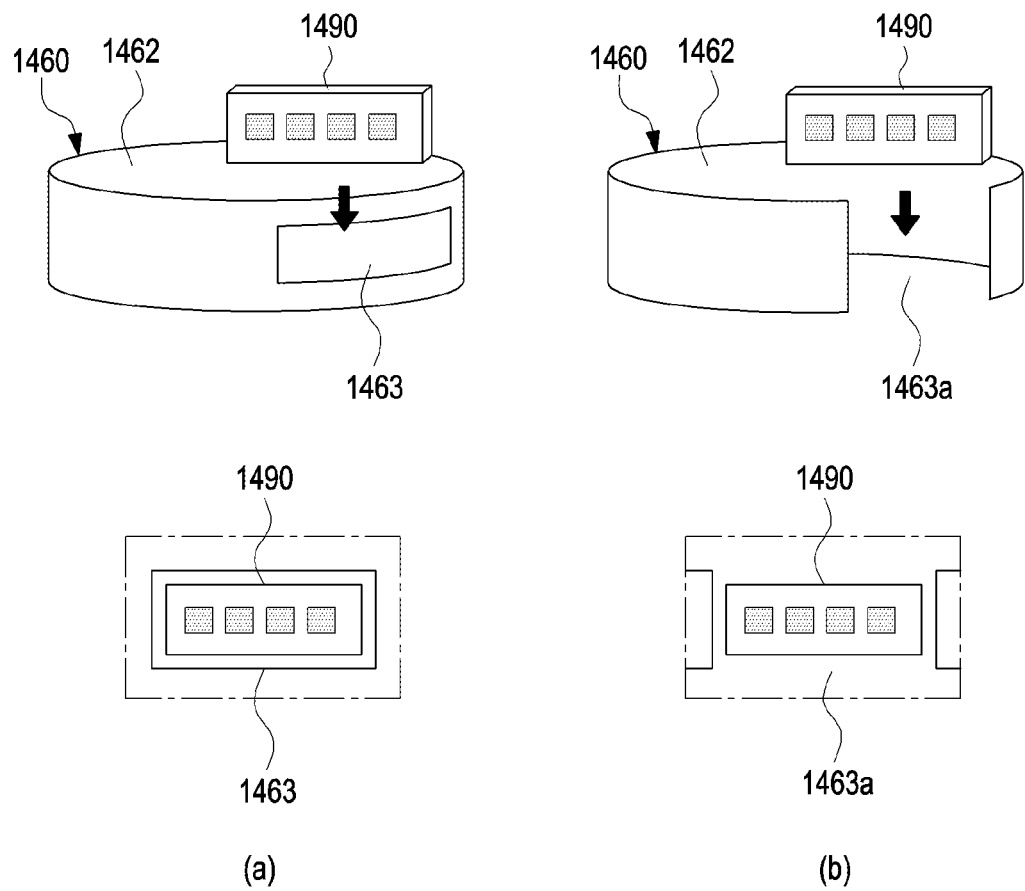
FIGS. 19(a)-19(b) are diagrams is a diagram illustrating a process of disposing the communication module of FIG. 18.

FIG. 18 is a diagram illustrating a display structure including a communication module, comprising communication circuitry, according to various embodiments. FIG. 19 is a diagram illustrating a process of disposing the communication module of FIG. 18.

Referring to FIGS. 18 and 19, a display module 1400 may include a communication module 1490 (comprising communication circuitry) for performing wireless communication with the outside. The description of the display modules 500 and 600 in the above-described embodiments may be applied adaptively to the display module 1400 of FIGS. 18 and 19.

According to various embodiments (referring to FIG. 18(*a*)), the communication module 1490 may be disposed on an edge area of a display panel 1424. For example, when viewed in parallel to the z-axis direction, the communication module 1490 may be disposed to overlap with at least part of the display panel 1424 and a window 1422.

According to various embodiments (referring to FIG. 18(*c*)), the communication module 1490 may be supported by a base member 1440. The communication module 1490 may be disposed on one side (−x-axis direction) of the base member 1440, and a stopper 1460 may be disposed on the other side (+x-axis direction) of the base member 1440. In another example, it may be said that the stopper 1460 and the communication module 1490 are disposed to face each other with respect to the base member 1440.

In an embodiment, an opening 1463 may be formed in the stopper 1460. As described later, the opening 1463 may refer to a hole 1463 (e.g., refer to FIG. 19) or an opening part 1463*a* (refer to FIG. 19) formed in a support part 1462, and thus these terms may be used interchangeably. Based on the opening 1463, an upper area (e.g., the support part 1462) of the stopper 1460 may be provided as the above-described protrusion (e.g., the projection 562 of FIG. 5). In an embodiment, part of the base member 1440 may be disposed in the opening 1463. For example, the stopper 1460 may be insert-injected into the base member 1440 so that at least part of the base member 1440 is inserted into the opening 1463. Accordingly, the base member 1440 on which the communication module 1490 is disposed and the stopper 1460 may be stably coupled. Further, the opening 1463 may maintain or improve radio wave transmission/reception performance of the communication module 1490 disposed adjacent to the stopper 1460 made of a metal material.

According to various embodiments (referring to FIG. 18(*b*)), a communication module 1490*a* may also be included in a polygonal display module 1400*a*. The above description of the window 1422, the communication module 1490, and the display panel 1424 may be applied to a window 1422*a*, the communication module 1490*a* comprising communication circuitry, and a display panel 1424*a*, and thus a redundant description will be avoided.

According to various embodiments (referring to FIG. 19), the stopper 1460 may include the hole 1463 formed to penetrate at least a partial area thereof, or the opening part 1463*a* which is completely opened. The hole 1463 or the opening part 1463*a* described in FIG. 19 may refer to the same configuration as or a similar configuration to the opening 1463 of FIG. 18(*c*). In an embodiment, the hole 1463 or the opening part 1463*a* may accommodate the communication module 1490. For example, the hole 1463 or the opening part 1463*a* may be formed in the support part 1462.

Figure 20:
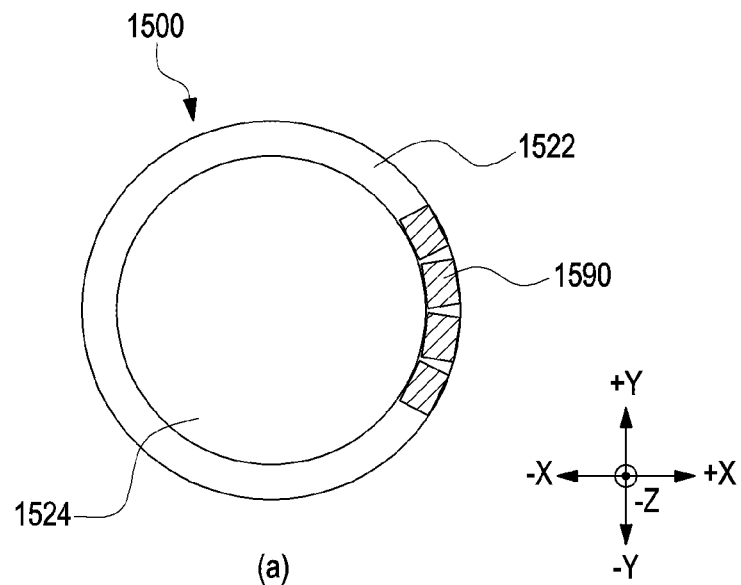
FIGS. 20(a)-20(b) are diagrams is a diagram illustrating a display module including a communication module according to another example embodiment.
Figure 20:
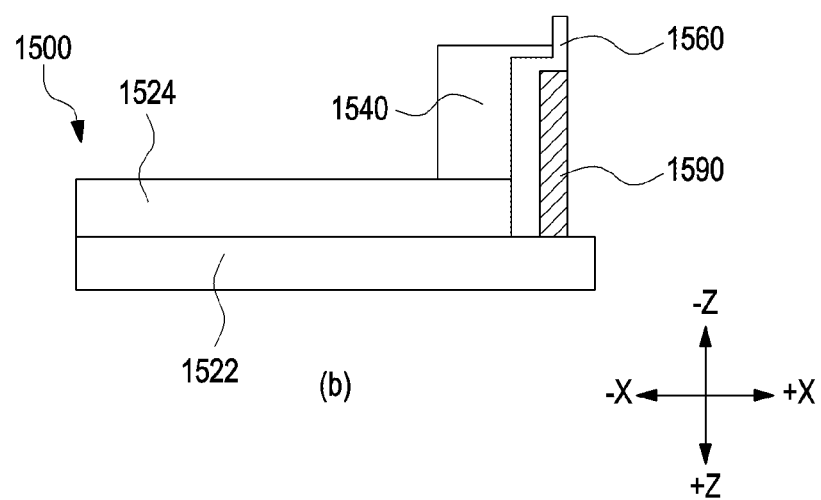
Figure 21:
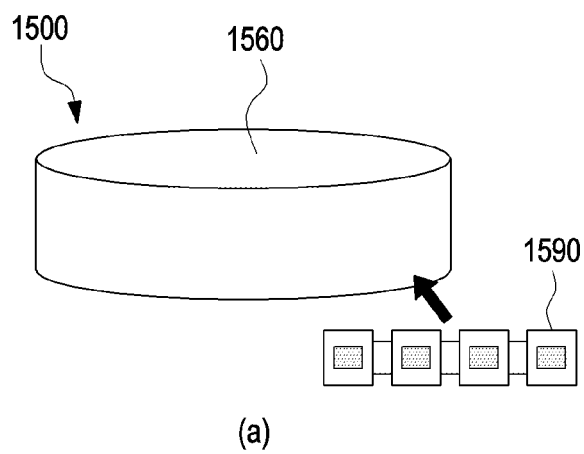
FIGS. 21(a)-21(b) are diagrams is a diagram illustrating a process of disposing the communication module of FIG. 20.
Figure 21:
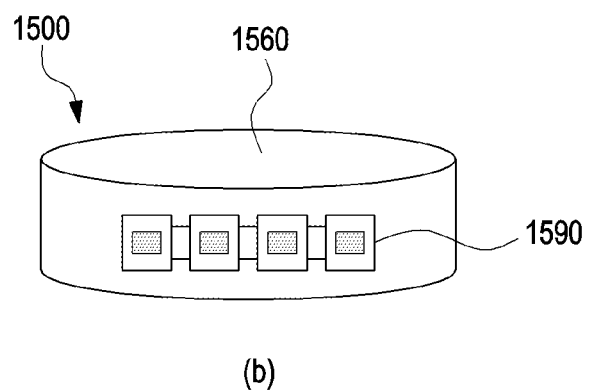

FIG. 20 is a diagram illustrating a display structure including a communication module according to another embodiment. FIG. 21 is a diagram illustrating a process of disposing the communication module of FIG. 20.

Referring to FIGS. 20 and 21, a communication module 1590 (comprising communication circuitry) may be disposed at an edge of a display module 1500. The descriptions of the display modules 500, 600, and 1400 in the above-described embodiments may be wholly or partially applied adaptively to the display module 1500 of FIGS. 20 and 21.

According to various embodiments, the communication module 1590 may be disposed on an edge area of a window 1522. For example, when viewed in parallel to the z-axis direction, the communication module 1590 may be disposed to overlap with at least part of the window 1522, without overlapping with a display panel 1524.

According to various embodiments, the communication module 1590 may be supported by a stopper 1560. For example, the communication module 1590 may be disposed outside the stopper 1560. In a certain embodiment, the stopper 1560 may include a recessed area for accommodating the communication module 1590. In an embodiment, a base member 1540 may be disposed on one side (−x-axis direction) of the stopper 1560, and the communication module 1590 may be disposed on the other side (+x-axis direction) of the stopper 1560. In another example, the communication module 1590 and the base member 1540 may be disposed to face each other with respect to the stopper 1560.

Figure 22:
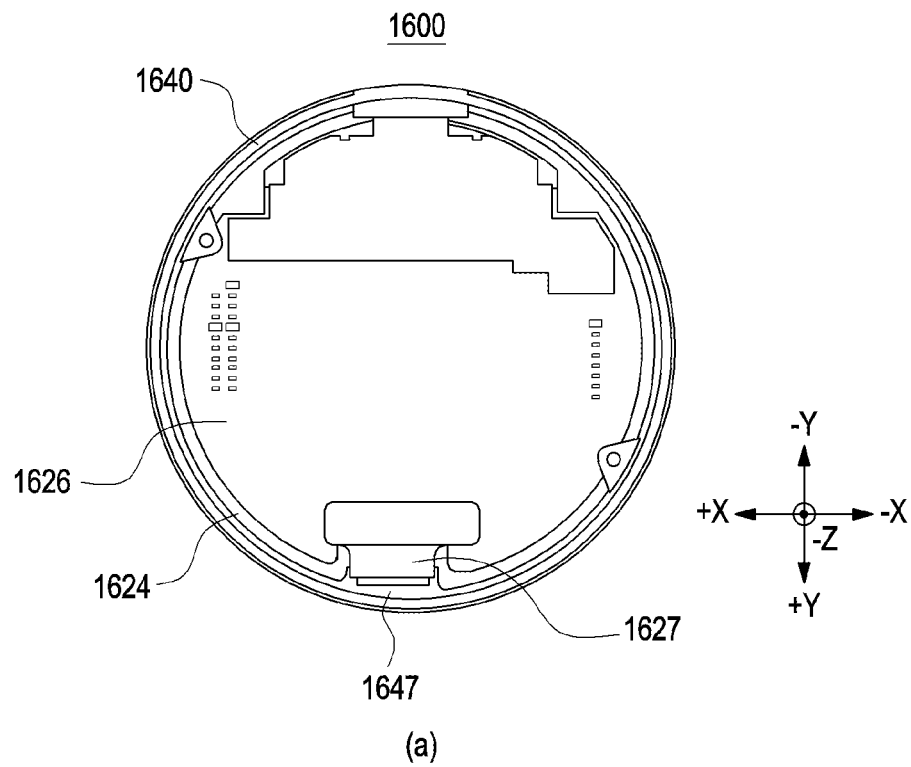
FIGS. 22(a)-22(b) are diagrams is a diagram illustrating a support member including a mounting portion and a display module including the same according to various example embodiments.
Figure 22:
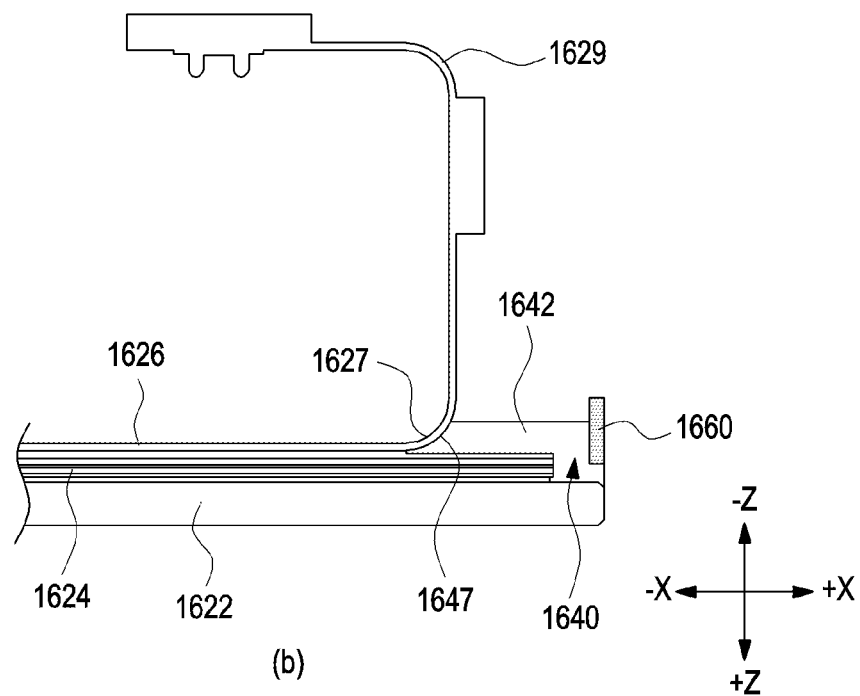

FIG. 22 is a diagram illustrating a base member including a mounting portion and a display module including the same according to various embodiments.

Referring to FIG. 22, a display module 1600 may include a circuit board 1626 including a bending area 1627, and a base member 1640 on which a mounting portion 1647 supporting the bending area 1627 is formed. The descriptions of the display modules 500, 600, 800, 900, 1000, 1100, 1200, 1300, 1400, and 1500 in the above-described embodiments may be applied adaptively to the display module 1600 of FIG. 22.

According to various embodiments, the circuit board 1626 may include the bending area 1627 that is partially bent, and an extension part 1629 extending from the bending area 1627, for connecting to other components in an electronic device (e.g., the electronic device 200 of FIG. 2). In order to reduce an excessive external load applied to the bending area 1627, caused by the connection of the extension part 1629 to other components, the mounting portion 1647 may support the bending area 1627. In an embodiment, the 'external load' may refer to a load applied to a display panel 1624 due to the elastic force of the circuit board 1626 itself and the shape of the bending area 1627.

According to various embodiments, the mounting portion 1647 may be formed in an inner edge area of the base member 1640. Alternatively, the mounting portion 1647 may refer to an outer surface of a cover area 1642. In an embodiment, the mounting portion 1647 may be concave in shape. For example, to smoothly support the bent circuit board 1626 (e.g., the bending area 1627), the mounting portion 1647 may be shaped into a smooth curve to correspond to the shape of the bending area 1627. In an embodiment, the bottom (+z-axis direction) of the cover area 1642 may cover an edge area of the display panel 1624, and the mounting portion 1647, which is a top area (−z-axis direction) of the cover area 1642, may support the bending area 1627. The base member 1640 may suppress or alleviate the load applied to the display panel 1624 due to the elastic force of the circuit board 1626 itself and the shape of the bending area 1627 by supporting the bending area 1627 using the mounting portion 1647.

Figure 23:
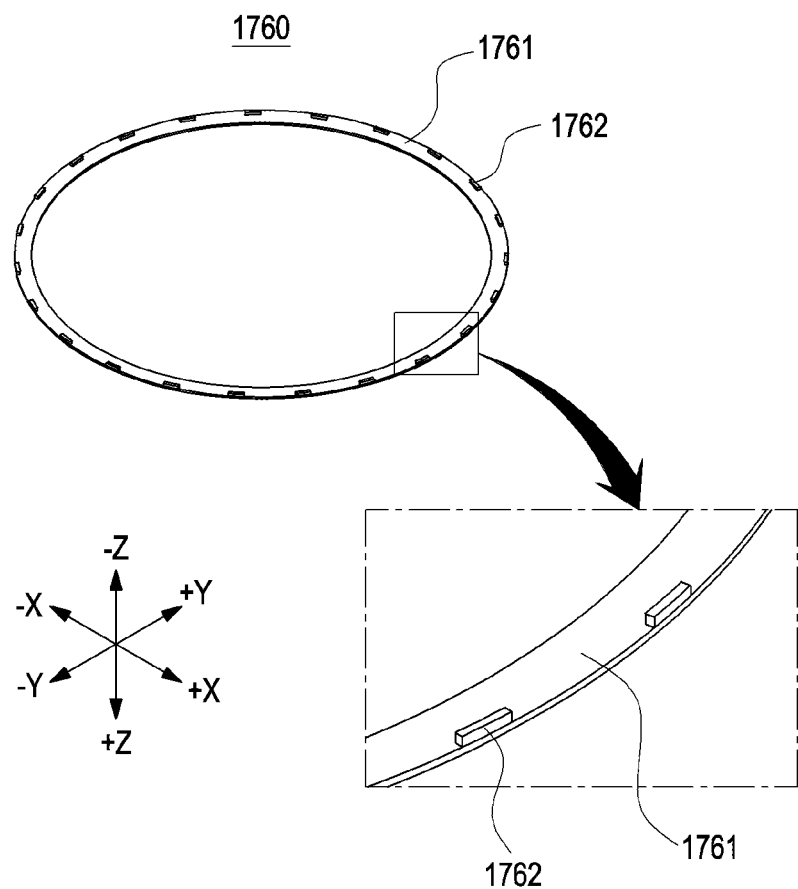
FIG. 23 is a diagram illustrating a stopper according to another example embodiment.
Figure 24:
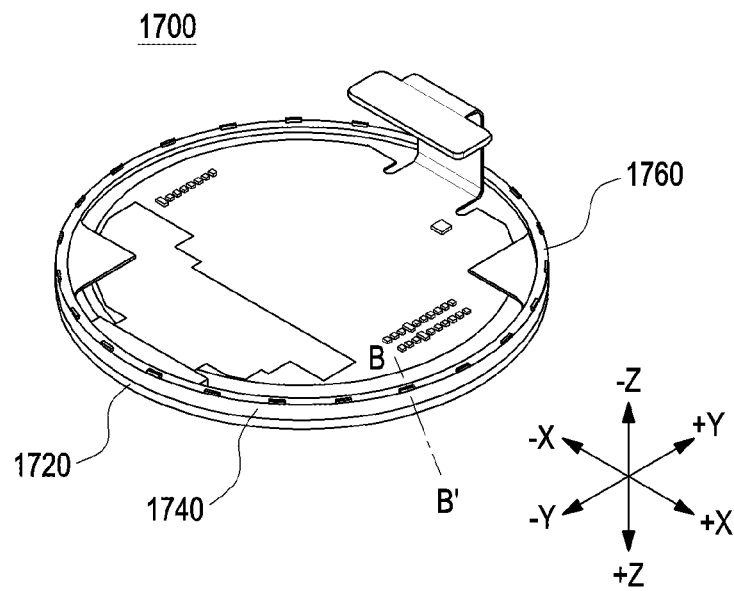
FIG. 24 is a diagram illustrating a display module including the stopper of FIG. 23.
Figure 25:
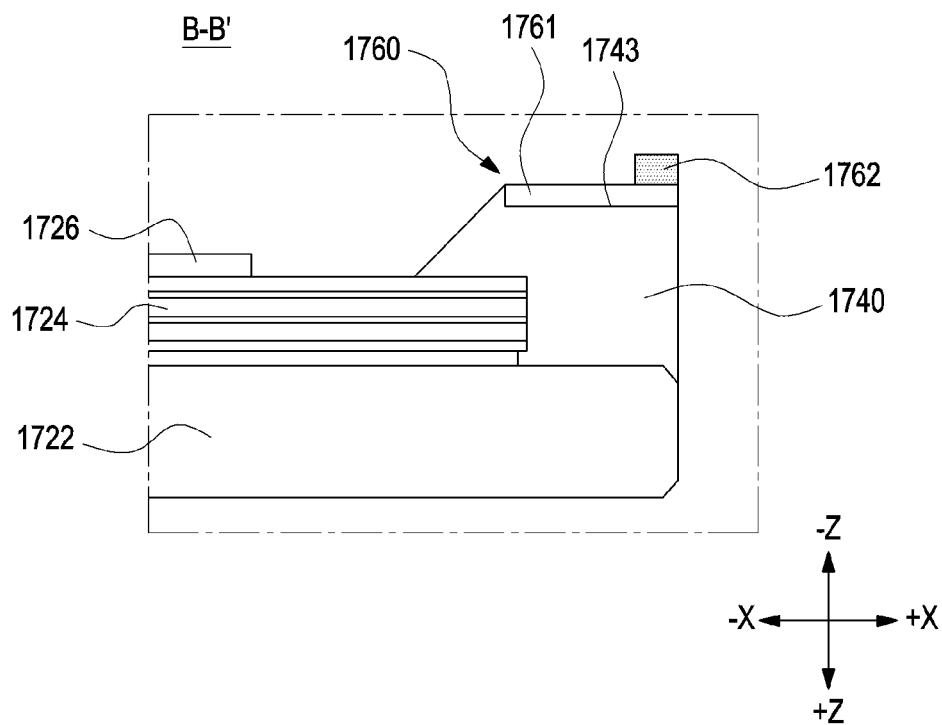
FIG. 25 is a diagram illustrating a cross section B-B' of FIG. 24.

FIG. 23 is a diagram illustrating a stopper according to another embodiment. FIG. 24 is a diagram illustrating a display structure including the stopper of FIG. 23. FIG. 25 is a diagram illustrating a cross section B-B' of FIG. 24.

Referring to FIGS. 23 to 25, a display module 1700 may include a display part 1720, a base member 1740 disposed in an edge area of the display part 1720, and a stopper 1760 on a top area (−z-axis direction) of the base member 1740. Unless otherwise specified, the descriptions of the display modules 500, 600, 800, 900, 1000, 1100, 1200, 1300, 1400, 1500, and 1600 in the above-described embodiments may be applied adaptively to the display module 1700 of FIGS. 23 to 25.

According to various embodiments, the stopper 1760 may include a sheet part 1761 and a protrusion 1762 disposed on the sheet part 1761. In an embodiment, the protrusion 1762 may be formed on the sheet part 1761 through an ultraviolet (UV) molding process. As described above, one or more protrusions 1762 may be formed, and the description of a support part (e.g., the support 561 of FIG. 5) may be wholly or partially applied adaptively to the sheet part 1761.

According to various embodiments, the sheet part 1761 may be disposed on a bottom surface 1743 (−z-axis direction) of the base member 1740. For example, the width of the sheet part 1761 may be formed to correspond to the width of the bottom surface 1743 of the base member 1740 or to be slightly smaller than the width of the bottom surface 1743. Unlike the above-described embodiments, the sheet part 1761 may have a larger width than a support part (e.g., the support 561 of FIG. 5).

In an embodiment, the sheet part 1761 may be provided as an area in which an adhesive member (e.g., the adhesive member 599 of FIG. 9) is to be disposed. For example, the sheet part 1761 may perform the same function as or a similar function to the above-described bonding part (e.g., the bonding part 541 of FIG. 8). In addition, the description of the sheet part 1761 may also be equally or similarly applied to a base member (e.g., the base member of FIG. 8) and a bonding part (e.g., the bonding part 541 of FIG. 8) in the above-described embodiments.

Figure 26:
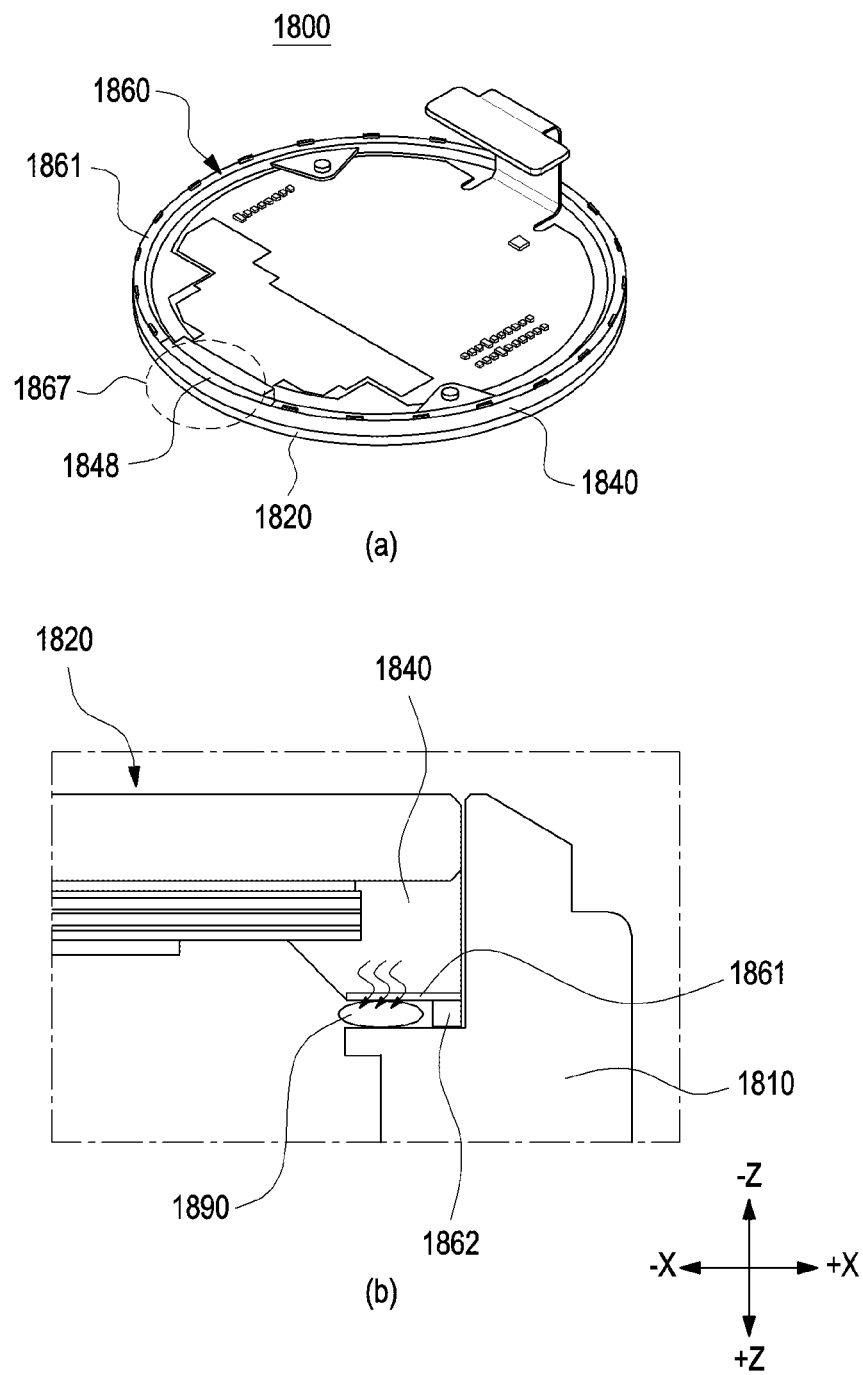
FIGS. 26(a)-26(b) are diagrams is a diagram illustrating a stopper and a display module including the stopper according to another example embodiment.

FIG. 26 is a diagram illustrating a stopper and a display structure including the stopper according to another embodiment.

Referring to FIG. 26, a display module 1800 according to various embodiments may include a display part 1820, a base member 1840 disposed on a top edge area of the display part 1820, and a stopper 1860 disposed on the base member 1840. The stopper 1860 may include a sheet part 1861 and a protrusion 1862. As described above, the description of the above-described support part (e.g., the support 561 of FIG. 6) may be applied adaptively to the sheet part 1861. Unless otherwise mentioned, all of the description of the display module 1700 of FIGS. 23 to 25 may be applied adaptively to the display module 1800 of FIG. 26. In addition, the description of the display part 1820, the base member 1840, and the stopper 1860 may be the same as or similar to that of the display part 1720, the base member 1740, and the stopper 1760 of FIGS. 23 to 25.

According to various embodiments, the stopper 1860 may include an opening area 1867 corresponding to at least part of a panel bending area (e.g., the panel bending area 627 of FIG. 13). For example, the opening area 1867 may be formed in at least part of the sheet part 1861. As the opening area 1867 is formed, the thickness (e.g., T1 of FIG. 13) of a second cover area 1848 of the base member 1840 may be reduced.

According to various embodiments, the stopper 1860 may include the sheet part 1861 formed of a material having high thermal conductivity. In an embodiment, the sheet part 1861 may be made of a metal material. For example, the sheet part 1861 may include copper (Cu). As the sheet part 1861 is formed of a material having high thermal conductivity, disassembly of the display module 1800 and a front housing 1810 may be facilitated. For example, even when an adhesive member 1890 is cured in a bonding space (e.g., the bonding space 530 in FIG. 9) provided by the protrusion 1862 and thus the sheet part 1861 and the front housing 1810 are bonded, the temperature of the cured adhesive member 1890 may easily be raised to a target temperature by transferring heat through the sheet part 1861. The description of the sheet part 1861 may also be equally or similarly applied to a base member (e.g., the base member 540 of FIG. 8) and a bonding part (e.g., the bonding part 541 of FIG. 8) in the above-described embodiments.

Figure 27:
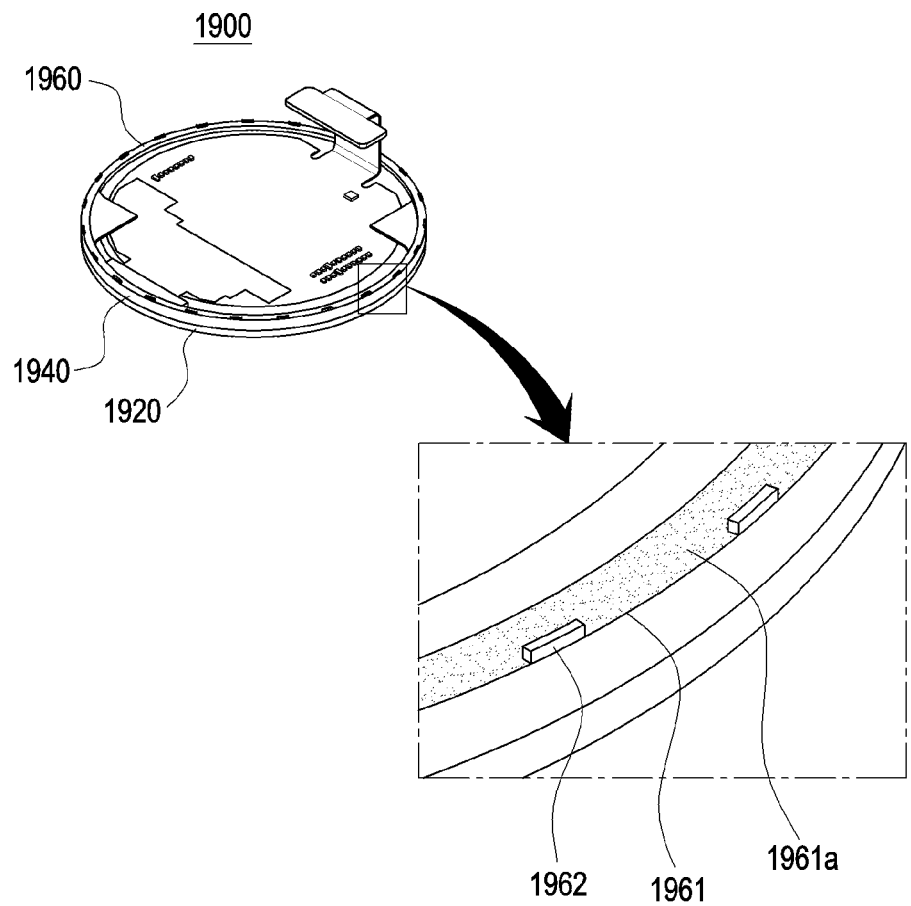
FIG. 27 is a diagram illustrating a stopper having a processed surface and a display module including the stopper according to various example embodiments.

FIG. 27 is a diagram illustrating a stopper having a processed surface and a display module including the stopper according to various embodiments.

Referring to FIG. 27, a display module 1900 according to various embodiments may include a display part 1920, a base member 1940 disposed on a top edge area of the display part 1920, and a stopper 1960 disposed on the base member 1940. The stopper 1960 may include a sheet part 1961 and a protrusion 1962. As described before, the description of the above-described support part (e.g., the support 561 of FIG. 6) may be applied adaptively to the sheet part 1961. Unless otherwise mentioned, all of the description of the display module 1700 of FIGS. 23 to 25 may be applied adaptively to the display module 1900 of FIG. 27. In addition, the description of the display part 1920, the base member 1940, and the stopper 1960 may be the same as or similar to that of the display part 1720, the base member 1740, and the stopper 1760 of FIGS. 23 to 25.

According to various embodiments, the surface 1961a of the stopper 1960/sheet part 1961 may be processed. In an embodiment, the surface 1961a of the stopper 1960 may be processed to increase a bonding force between the sheet part 1961 and a front housing (e.g., the front housing 510 of FIG. 9). In an embodiment, a concavo-convex pattern may be formed on the surface 1961a of the sheet part 1961. For example, when the protrusion 1962 is molded into the sheet part 1961, fine irregularities may be molded together on the surface 1961a of the sheet part 1961. However, this is not essential, and fine irregularities may be molded separately from the protrusion 1962. In addition, the concavo-convex pattern may be formed by laser processing, and a separate film may be further attached. The surface of the stopper 1960 may be processed in various other manners. In a certain embodiment, the surface 1961a of the sheet part 1961 may be further coated with a silicone material.

The description (e.g., various processes performed on the surface 1961a of the sheet part 1961) of the stopper 1960 in FIG. 27 may be equally or similarly applied to the stoppers (e.g., the stopper 560 of FIG. 6) and/or the base members (e.g., the base member 540 of FIG. 6) according to all the above-described embodiments. For example, when the stopper 560 is insert-molded to the base member (e.g., the base member 540 of FIG. 6) like an afore-described stopper (e.g., the stopper 560 of FIG. 6), the surface (e.g., the bonding part 541) of the base member 540 facing a front housing (e.g., the front housing 510 of FIG. 9) may be processed. In another example, when the stopper 560 does not include the separate sheet part 1961 like the stopper 560 of FIG. 6, the surface (e.g., the bonding part 541) of the base member 540 may be processed, and the same function as the surface 1961a of the sheet part 1961 described in FIG. 27 may be achieved by the processed surface of the base member 540.

Figure 28:
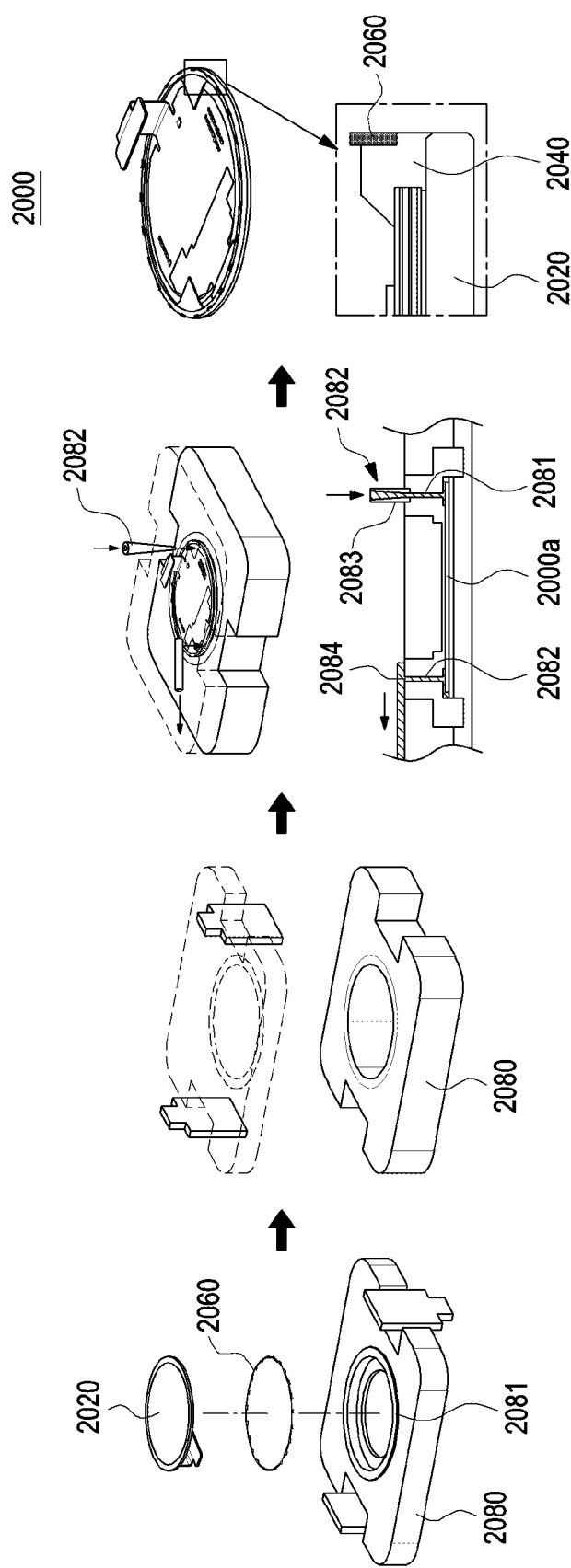
FIG. 28 is a diagram illustrating a process of manufacturing a display module according to various example embodiments.
Figure 29:
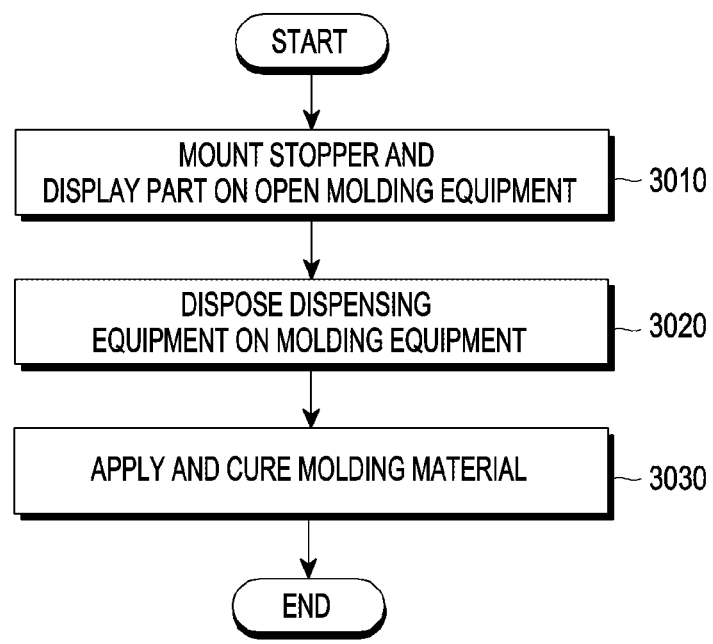
FIG. 29 is a flowchart illustrating a process of manufacturing a display module according to various example embodiments.

FIG. 28 is a diagram illustrating a process of manufacturing a display module according to various embodiments. FIG. 29 is a flowchart illustrating a process of manufacturing a display module according to various embodiments.

Referring to FIGS. 28 and 29, the process of manufacturing a display module may include operation 3010 of mounting a stopper and a display part 2020 on opened molding equipment, operation 3020 of disposing dispensing equipment on molding equipment, and operation 3030 of applying and curing a molding material.

According to various embodiments, molding equipment 2080 may include a plate part 2081 in which a stopper 2060 and the display part 2020 are to be mounted. The plate part 2081 may be formed of an elastic material. For example, the plate part 2081 may include silicon. The size of the plate part 2081 may correspond to the size of the display part 2020 (e.g., the window 522 of FIG. 5).

In operation 3010 of mounting the stopper 2060 and the display part 2020 on the open molding equipment 2080, the stopper 2060 and the display part 2020 may be sequentially disposed on the plate part 2081 described above.

Subsequently, dispensing equipment 2082 may be disposed on the molding equipment 2080 to shield the opened molding equipment 2080 and perform molding (3020). In an embodiment, the shielded molding equipment 2080 may include two or more holes 2083 and 2084. One hole 2083 is provided as a hole 2083 through which a liquid material for molding is injected, and the other hole 2084 is provided as a hole 2084 through which air is discharged from the inside of the molding equipment 2080. In a certain embodiment, a suction may be performed in the hole 2084 to discharge air from the inside of the molding equipment 2080.

After the dispensing equipment 2082 is disposed, the molding material may be applied into the molding equipment 2080 and cured (3030). The molding material may be delivered into the molding equipment 2080 through the hole 2083 for injection. In addition, as described above, as air is discharged from the inside of the molding equipment 2080 through the hole 2084 for air discharge, an air trap phenomenon inside the molding may be suppressed, and the molding process may be performed without interruptions. When the curing is completed, a base member 2040 having the stopper 2060 insert-injected therein may be coupled on the display part 2020.

According to various embodiments, an electronic device may include a front housing (e.g., the front housing 410 of FIG. 5) including an opening and a bonding area formed around the opening; a display module (e.g., the display module 500 of FIG. 6) disposed to cover the opening by at least part thereof, wherein the display module includes: a display part (e.g., the display part 520 of FIG. 6) to provide visual information to a user; a base member (e.g., the base member 540 of FIG. 6) disposed along an edge area of the display part and including a bonding part formed to correspond to the bonding area; and a stopper (e.g., the stopper 560 of FIG. 6) disposed to surround at least part of the bonding part and formed toward the housing, to provide a bonding space between the bonding area and the bonding part; and an adhesive member (e.g., the adhesive member 599 of FIG. 9) disposed in the bonding space, to connect, directly or indirectly, between the bonding area and the bonding part.

According to an embodiment, the stopper may include a support part (e.g., the support 561 of FIG. 6) extending along a peripheral direction of the bonding part, and a protrusion (e.g., the protrusion 562 of FIG. 6) protruding from the support part toward the front housing, and as the protrusion has one end extending a predetermined distance from the bonding part and contacts the bonding area, the bonding space may have a gap width as large as the predetermined distance.

According to an embodiment, the stopper may include an opening area (e.g., the opening area 667 of FIG. 10) which is at least partially open.

According to an embodiment, the base member may include a cover area (e.g., the cover area 647 of FIG. 11A) covering a side surface edge and a bottom surface edge of at least part of the display part, and the stopper may be disposed to make the opening area located in the cover area.

According to an embodiment, the stopper may be formed of a conductive metal material, and include a conductive part at least partially extending in an inward direction of the display module, and the base member may include an accommodation area to accommodate the conductive part therein.

According to an embodiment, the display module may further include a communication module (e.g., the communication module 1490 of FIG. 18), and the communication module may be disposed adjacent to the base member or the stopper.

According to an embodiment, the stopper may include a sheet part (e.g., the sheet part 1761 of FIG. 23) disposed on, directly or indirectly, the bonding part, with a width corresponding to a thickness of the bonding part, and a protrusion (e.g., the protrusion 1762 of FIG. 23) protruding from at least part of the sheet part, and the adhesive member may be disposed on, directly or indirectly, a surface of the sheet part.

According to an embodiment, the surface of the sheet part may be processed to have a concavo-convex shape.

According to an embodiment, the sheet part may be formed of a metal material.

According to an embodiment, the display module may include a flexible circuit board which is at least partially bendable, and the base member may include a mounting portion (e.g., the mounting portion 1647 of FIG. 22) at least partially concave on a surface of the base member facing the front housing, and supporting a bending area of the flexible circuit board.

According to an embodiment, the stopper may be divided into a plurality of stoppers.

According to an embodiment, the stopper may have an end on a first side, contacting the bonding area, and an end on a second side opposite to the first side, spaced apart from at least part of the window.

According to various embodiments, an electronic device may include a front housing (e.g., the front housing 410 of FIG. 5) including an opening and a bonding area formed to be directed in a first direction around the opening; a display module (e.g., the display module 500 of FIG. 6) bonded to, directly or indirectly, the front housing to provide visual information to a user, wherein the display module includes a window (e.g., the window 522 of FIG. 6), a display panel (e.g., the display panel 524 of FIG. 6) disposed on/at/proximate the window and outputting visual information, and a circuit board (e.g., the circuit board 526 of FIG. 6) connected to the display panel; a base member (e.g., the base member 540 of FIG. 6) disposed along a periphery of the display part, and including a bonding part (e.g., the boding part 541 of FIG. 8) formed to be directed in a second direction opposite to the first direction to face the bonding area; and a stopper including a support part (e.g., the support 561 of FIG. 6) at least partially disposed along a periphery of the base member on the base member or inside the base member, and a protrusion (e.g., the protrusion 562 of FIG. 5) extending in the second direction from the support part; and an adhesive member (e.g., the adhesive member 599 of FIG. 9) to couple the bonding area and the bonding part with each other. The protrusion may provide a bonding space (e.g., the bonding space 530 of FIG. 9) being a gap space between at least the bonding area and the bonding part by contact between an end of the protrusion in the second direction and the bonding area, and the adhesive member may be disposed inside the bonding space.

According to an embodiment, the stopper may include an opening area (e.g., the opening area 667 of FIG. 10) in which at least part of the support part is open.

Each embodiment herein may be used in combination with any other embodiment(s) described herein.

According to an embodiment, the base member may include a cover area covering a side surface edge area and a bottom surface edge area of at least part of the display panel, and the stopper may be disposed to make the opening area located in the cover area.

According to an embodiment, the stopper may be formed of a conductive metal material, and include a conductive part at least partially extending in an inward direction of the display module from the support part, and the base member may include an accommodation area to accommodate the conductive part therein.

According to an embodiment, the display module may further include a communication module, and the communication module may be disposed adjacent, directly or indirectly, to the base member and/or the stopper.

According to an embodiment, the end of the protrusion in the second direction may contact the bonding area, and an end of the protrusion in the first direction may contact at least part of the window.

According to an embodiment, a reinforcing coating may be applied to at least a partial area of the window contacting the stopper. According to an embodiment, the support part may be disposed on, directly or indirectly, the bonding part, with a width corresponding to the bonding part, and the bonding member may be disposed on, directly or indirectly, the support part.

While the disclosure has been described in the context of an embodiment by way of example, it should be understood that the embodiment is for illustrative purposes rather than limiting the disclosure. It will be apparent to those skilled in the art that various changes can be made in form and detail without departing from the overall scope of the disclosure, including the appended claims and their equivalents.

The invention claimed is:

1. An electronic device comprising:
   a front housing including an opening and a bonding area formed around the opening;
   a display module disposed to cover at least the opening by at least part thereof, wherein the display module comprises:
   a display configured to provide visual information to a user;
   a base disposed along an edge area of the display and including a bonding part formed to correspond to at least the bonding area; and a stopper disposed to surround at least part of the bonding part and formed toward the housing, to provide a bonding space between at least the bonding area and the bonding part; and an adhesive member, comprising adhesive material, disposed in the bonding space, to connect between at least the bonding area and the bonding part.

2. The electronic device of claim 1, wherein the stopper includes a support extending along a peripheral direction of the bonding part, and a protrusion protruding from the support toward the front housing, and wherein as the protrusion has one end extending a predetermined distance from the bonding part and which contacts the bonding area, and the bonding space has a gap width at least as large as the predetermined distance.

3. The electronic device of claim 1, wherein the stopper includes an opening area which is at least partially open.

4. The electronic device of claim 3, wherein the base includes a cover area covering a side surface edge and a bottom surface edge of at least part of the display, and wherein the stopper is disposed to make the opening area located in the cover area.

5. The electronic device of claim 1, wherein the stopper comprises a conductive metal material, and includes a conductive part at least partially extending in an inward direction of the display module, and wherein the base includes an accommodation area to accommodate at least part of the conductive part therein.

6. The electronic device of claim 1, wherein the display module further includes a communication module comprising communication circuitry, and wherein the communication module is disposed adjacent to the base and/or the stopper.

7. The electronic device of claim 1, wherein the stopper includes a sheet disposed on the bonding part, with a width corresponding to a thickness of the bonding part, and a protrusion protruding from at least part of the sheet, and the adhesive member is disposed on a surface of the sheet.

8. The electronic device of claim 7, wherein the surface of the sheet comprises a concavo-convex shape.

9. The electronic device of claim 7, wherein the sheet is formed of a metal material.

10. The electronic device of claim 1, wherein the display module further includes a flexible circuit board which is at least partially bendable, and wherein the base includes a mounting portion at least partially concave on a surface of the base facing the front housing, and supporting a bending area of the flexible circuit board.

11. The electronic device of claim 1, wherein the stopper is divided into a plurality of stoppers.

12. The electronic device of claim 1, wherein the stopper has an end on a first side, contacting the bonding area, and an end on a second side opposite to the first side, spaced apart from at least part of the window.

13. An electronic device comprising:

a front housing including an opening and a bonding area formed to be directed in a first direction around the opening;

a display module bonded to the front housing to provide visual information to a user, wherein the display module comprises:

a display including a window, a display panel disposed proximate the window and for outputting visual information, and a circuit board connected to the display panel;

a base disposed along a periphery of the display, and including a bonding part formed to be directed in a second direction opposite to the first direction to face the bonding area; and a stopper including a support at least partially disposed along a periphery of the base on the base and/or inside the base, and a protrusion extending in the second direction from the support; and an adhesive member, comprising adhesive material, to couple at least the bonding area and the bonding part with each other, wherein the protrusion provides a bonding space comprising a gap space between at least the bonding area and the bonding part at least by contact between an end of the protrusion in the second direction and the bonding area, and wherein the adhesive member is disposed inside the bonding space.

14. The electronic device of claim 13, wherein the stopper includes an opening area in which at least part of the support is open.

15. The electronic device of claim 14, wherein the base includes a cover area covering a side surface edge area and a bottom surface edge area of at least part of the display panel, and wherein the stopper is disposed to make the opening area located in the cover area.

16. The electronic device of claim 13, wherein the stopper comprises a conductive metal material, and includes a conductive part at least partially extending in an inward direction of the display module from the support, and wherein the base includes an accommodation area to accommodate the conductive part therein.

17. The electronic device of claim 13, wherein the display module further includes a communication module comprising communication circuitry, and wherein the communication module is disposed adjacent to the base and/or the stopper.

18. The electronic device of claim 13, wherein the end of the protrusion in the second direction contacts the bonding area, and an end of the protrusion in the first direction contacts at least part of the window.

19. The electronic device of claim 18, further comprising a reinforcing coating applied to at least a partial area of the window contacting the stopper.

20. The electronic device of claim 13, wherein the support is disposed on the bonding part, with a width corresponding to the bonding part, and wherein the bonding member is disposed on the bonding part.

* * * * *